(12) United States Patent
Wang et al.

(10) Patent No.: US 12,132,247 B2
(45) Date of Patent: Oct. 29, 2024

(54) SEMICONDUCTOR PACKAGE AND MANUFACTURING METHOD THEREOF

(71) Applicant: Taiwan Semiconductor Manufacturing Company, Ltd., Hsinchu (TW)

(72) Inventors: Yen-Ping Wang, Changhua County (TW); Chun-Lin Lu, Hsinchu (TW); Han-Ping Pu, Taichung (TW); Kai-Chiang Wu, Hsinchu (TW); Chung-Yi Hsu, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 71 days.

(21) Appl. No.: 17/874,291

(22) Filed: Jul. 27, 2022

(65) Prior Publication Data

US 2022/0359977 A1 Nov. 10, 2022

Related U.S. Application Data

(62) Division of application No. 16/997,958, filed on Aug. 20, 2020, now Pat. No. 11,569,562.

(60) Provisional application No. 62/947,522, filed on Dec. 12, 2019.

(51) Int. Cl.
| | |
|---|---|
| *H01Q 1/22* | (2006.01) |
| *H01L 23/31* | (2006.01) |
| *H01L 23/66* | (2006.01) |
| *H01Q 9/04* | (2006.01) |

(52) U.S. Cl.
CPC ........... *H01Q 1/2283* (2013.01); *H01L 23/31* (2013.01); *H01L 23/66* (2013.01); *H01Q 9/0407* (2013.01)

(58) Field of Classification Search
CPC .... H01Q 1/2283; H01Q 9/0407; H01Q 1/523; H01L 23/31; H01L 23/66; H01L 23/552; H01L 23/481; H01L 24/13; H01L 24/16; H01L 24/81; H01L 2223/6677
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |
| 11,328,987 | B2 * | 5/2022 | Ndip .................. H01Q 1/2283 |
| 2019/0319347 | A1 * | 10/2019 | Fang .................. H01L 23/3128 |
| 2020/0035607 | A1 * | 1/2020 | Lee .................... H01L 23/5383 |

(Continued)

*Primary Examiner* — Dao H Nguyen
(74) *Attorney, Agent, or Firm* — JCIPRNET

(57) ABSTRACT

A semiconductor package and a manufacturing method thereof are provided. The semiconductor package includes: patch antennas, encapsulated by a first encapsulant; a device die, vertically spaced apart from the patch antennas, and electrically coupled to the patch antennas; and at least one redistribution structure, disposed between the patch antennas and the device die, and including electromagnetic bandgap (EBG) structures laterally surrounding each of the patch antennas.

20 Claims, 52 Drawing Sheets

(56) References Cited

U.S. PATENT DOCUMENTS

| | | | |
|---|---|---|---|
| 2020/0303335 A1* | 9/2020 | Chu | H01L 24/20 |
| 2020/0303806 A1* | 9/2020 | Wu | H01L 23/49816 |
| 2020/0328166 A1* | 10/2020 | Tsai | H01Q 1/243 |

* cited by examiner

SEMICONDUCTOR PACKAGE AND MANUFACTURING METHOD THEREOF

CROSS-REFERENCE TO RELATED APPLICATION

This application is a divisional application of and claims the priority benefit of a prior application Ser. No. 16/997,958, filed on Aug. 20, 2020. The prior application Ser. No. 16/997,958 claims the priority benefits of U.S. provisional application Ser. No. 62/947,522, filed on Dec. 12, 2019. The entirety of each of the above-mentioned patent applications is hereby incorporated by reference herein and made a part of this specification.

BACKGROUND

Antenna in package (AiP) combines antenna(s) with an integrated device die into a package structure. AiP has been recognized as one of the most promising antenna solution for high-speed short-range wireless communications because of high gain and broad bandwidth. However, further development on AiP is stilled required for overcoming challenges including undesired coupling between antennas and interference between antennas and device die.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A, FIG. 2C, FIG. 2E, FIG. 2G and FIG. 2I are schematic cross-sectional views illustrating passive filters according to some embodiments of the present disclosure.

FIG. 6A through FIG. 6M are schematic cross-sectional views illustrating structures at various stages during the manufacturing method shown in FIG. 5.

DETAILED DESCRIPTION

Figure 1A:
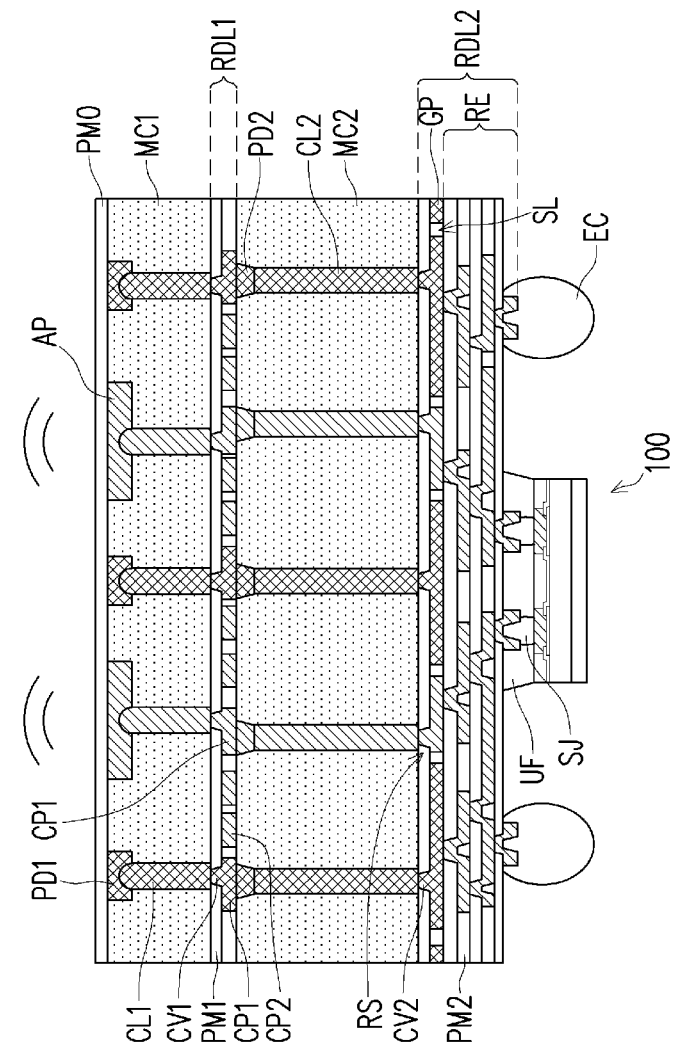
FIG. 1A is a schematic cross-sectional view illustrating a semiconductor package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
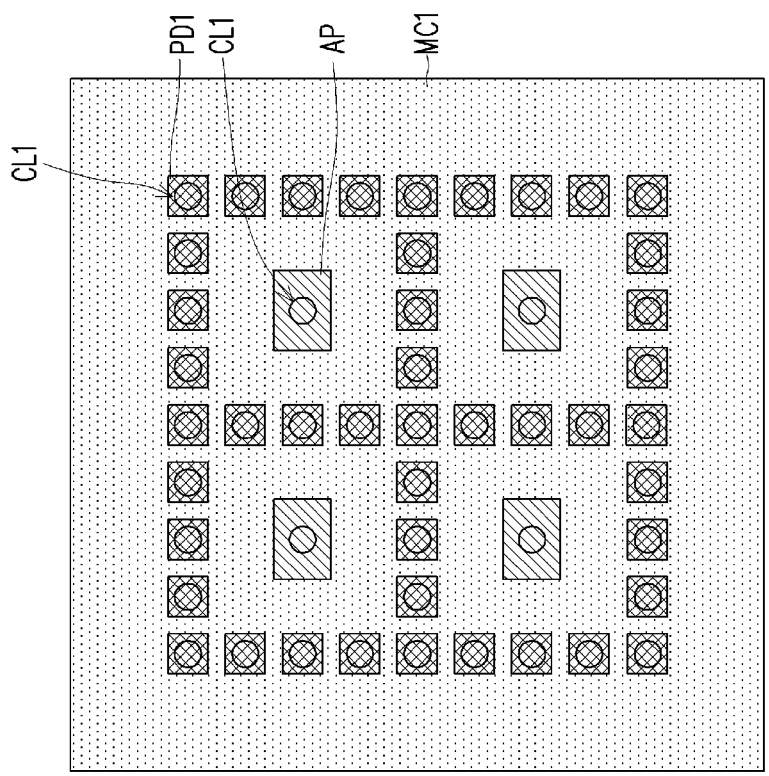
FIG. 1B is a schematic plane view illustrating components in the upper encapsulant of the semiconductor package as shown in FIG. 1A.
Figure 1C:
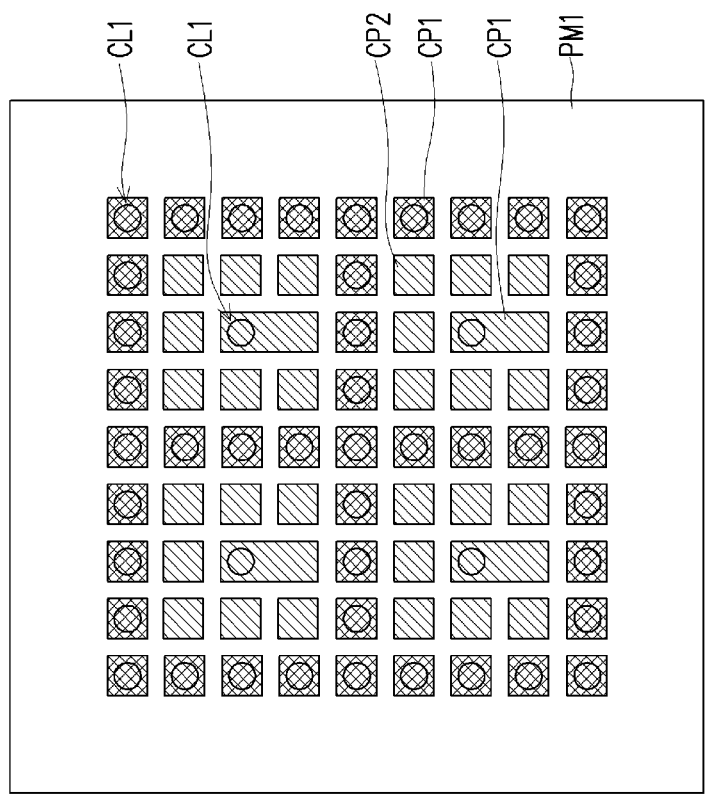
FIG. 1C is a schematic plane view illustrating components including an upper redistribution structure in the semiconductor package 10 as shown in FIG. 1A.
Figure 1D:
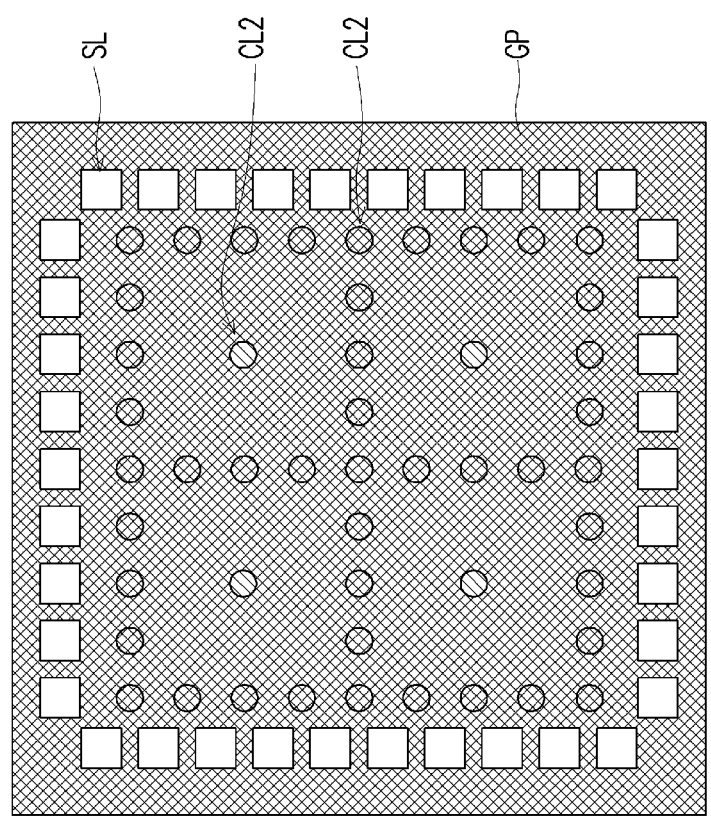
FIG. 1D is a schematic plane view illustrating components including a ground plane in a lower redistribution structure in the semiconductor package as shown in FIG. 1A.

FIG. 1A is a schematic cross-sectional view illustrating a semiconductor package 10 according to some embodiments of the present disclosure. FIG. 1B is a schematic plane view illustrating components in an encapsulant MC1 of the semiconductor package as shown in FIG. 1A. FIG. 1C is a schematic plane view illustrating components including a redistribution structure RDL1 in the semiconductor package 10 as shown in FIG. 1A. FIG. 1D is a schematic plane view illustrating components including a ground plane GP in a redistribution structure RDL2 in the semiconductor package as shown in FIG. 1A.

Referring to FIG. 1A, the semiconductor package 10 is an antenna-in-package (AiP) structure. The semiconductor package 10 includes a device die 100 and antennas AP electrically coupled to the device die 100, and includes multiple redistribution structures RDL1, RDL2 between the device die 100 and the antennas AP. The antennas AP may be formed as conductive patches, and may also be referred as patch antennas. The device die 100 may include electrical integrated circuit configured to be operated in a frequency range suitable for wireless transmission. For instance, the device die 100 may include radio frequency integrated circuit (RFIC). In some embodiments, the device die 100 is attached to a bottom side of the redistribution structure RDL2. In addition, the redistribution structure RDL1 is disposed between the redistribution structure RDL2 and the antennas AP, and include conductive patterns CP. In some embodiments, some of the conductive patterns CP (i.e., the conductive patterns CP2 to be described thereafter) in the redistribution structure RDL1 and a ground plane GP formed in the redistribution structure RDL2 form portions of electromagnetic bandgap (EBG) structures PF. Alternatively, these conductive patterns CP2 form the EBG structures PF alone. The EBG structure PF is a type of passive filter. During operation, a current loop may be induced on the ground plane GP by the antennas AP, and may result in compromise of gain and efficiency of the antennas AP. By disposing the EBG structures PF, this current loop can be cut off. Consequently, surface wave at the ground plane GP can be suppressed, thus gain and efficiency of the antennas AP can be improved. On top of that, a vertical distance between the antennas AP and the redistribution structure RDL1 can be reduced (e.g., 30% reduction). In addition, the conductive patterns CP2 of the EBG structures PF may be functioned as radiation reflectors for further enhancing gain of the antennas AP. Moreover, the conductive patterns CP2 of the EBG structures PF can further shield the device die 100 from electromagnetic wave input to or output from the antennas AP. Therefore, interference between the antennas AP and the device die 100 can be reduced.

In some embodiments, the antennas AP are surrounded by conductive pads PD1, and conductive columns CL1 connect the antennas AP as well as the conductive pads PD1 to the redistribution structure RDL1. Some of the conductive columns CL1 are connected to the conductive pads PD1, and are electrically grounded along with the conductive pads PD1. In this way, coupling between the antennas AP can be blocked by the grounded conductive pads PD1 and conductive columns CL1. In other words, the antennas AP can be decoupled from one another. In addition, additional resonance may be generated between the antennas AP and the grounded conductive pads PD1 and conductive columns CL1. As a result, bandwidth of the antennas AP can be further broadened. Alternatively, a vertical distance between the antennas AP and the ground plane GP can be reduced. On the other hand, some of the conductive columns CL1 may be connected to the antennas AP, and are configured to transmit signals between the antennas AP and the device die 100.

Referring to FIG. 1A and FIG. 1B, in some embodiment, the antennas AP, the conductive pads PD1 and the conductive columns CL1 are laterally encapsulated by an encapsulant MC1. As shown in FIG. 1A, top surfaces of the antennas AP and the conductive pads PD1 may be substantially coplanar with a top surface of the encapsulant MC1. In addition, the top surfaces of the antennas AP and the conductive pads PD1 may be covered by a polymer layer PM0, and the encapsulant MC1 may be regarded as spanning between the polymer layer PM0 and the redistribution structure RDL1. The conductive columns CL1 extend from the antennas AP and the conductive pads PD1 to a bottom side of the encapsulant MC1, and are in contact with the redistribution structure RDL1. As shown in FIG. 1B, the antennas AP are laterally spaced apart from one another, and each surrounded by some of the conductive pads PD1 and the conductive columns CL1 connected to these conductive pads PD1. In some embodiments, the antennas AP respectively have a footprint area greater than a footprint area of each of the conductive pads PD1. Moreover, the antennas AP and the conductive pads PD1 may be formed as rectangular conductive patches. However, those skilled in the art may modify dimensions and shapes of the antennas AP and the conductive pads PD1 according to design requirements, the present disclosure is not limited thereto.

Referring to FIG. 1A, the conductive patterns CP in the redistribution structure RDL1 are formed in a stack of polymer layers PM1. Conductive vias CV1 may be formed in the stack of polymer layers PM1, and configured to connect some of the conductive patterns CP to the overlying conductive columns CL1. As shown in FIG. 1C, some of the conductive patterns CP (referred as conductive patterns CP1) are connected to the conductive columns CL1, whereas others of the conductive patterns CP (referred as conductive patterns CP2) may not be connected to the conductive columns CL1. Further, some of the conductive patterns CP1 are connected to the conductive pads PD1 (as shown in FIG. 1A and FIG. 1B) through some of the conductive columns CL1, and are electrically grounded along with the conductive pads PD1 and the conductive columns CL1 connected therebetween. Others of the conductive patterns CP1 are connected to the antennas AP through the overlying conductive columns CL1, and may be functioned as feed lines for feeding signals to the antennas AP. In addition, the conductive patterns CP1 connected to the antennas AP are laterally surrounded by the conductive patterns CP2 not connected to the conductive columns CL1. In this way, the antennas AP may be each laterally surrounded by the conductive patterns CP2. The conductive patterns CP2 are portions of the EBG structures PF, or form the EBG structures PF alone. In some embodiments, those conductive patterns CP1 connected to the antennas AP are depicted as stripes, whereas the remainder of the conductive patterns CP are depicted as rectangular patches. However, those skilled in the art may adjust dimensions and shapes of the conductive patterns CP according to design requirements, the present disclosure is not limited thereto. Furthermore, although not shown, additional signal lines may be further formed in the stack of polymer layers PM1, and the additional signal lines may be spreading over or below the conductive patterns CP.

Referring to FIG. 1A, in some embodiments, conductive columns CL2 are connecting between the redistribution structures RDL1, RDL2, and are laterally encapsulated by an encapsulant MC2. According to certain embodiments, the conductive columns CL2 are connected to the conductive patterns CP1 in the redistribution structure RDL1 through conductive pads PD2, and connected to the redistribution structure RDL2 without a conductive pad in between. Alternatively, the conductive columns CL2 may be connected to the overlying redistribution structure RDL1 and the underlying redistribution structure RDL2 without a conductive pad in between. Some of the conductive columns CL2 are connected to the antennas AP through some of the conductive patterns CP1 and the overlying conductive columns CL1, and are configured to transmit signals between the device die 100 and the antennas AP. Others of the conductive columns CL2 are connected to the conductive pads PD1 through others of the conductive patterns CP1 and the overlying conductive columns CL1, and are electrically grounded.

Referring to FIG. 1A, a top side of the redistribution structure RDL2 is in contact with bottom surfaces of the conductive columns CL2 and the encapsulant MC2, whereas a bottom side of the redistribution structure RDL2 is attached with the device die 100. In some embodiments, the redistribution structure RDL2 includes a stack of polymer layers PM2, and includes the ground plane GP and redistribution elements RE formed in the stack of polymer layers PM2. The redistribution elements RE are configured to out-rout the device die 100 to a larger routing area, and may include conductive traces and conductive vias. The conductive traces respectively extend on a surface of one of the polymer layers PM2, whereas the conductive vias respectively penetrate at least one of the polymer layers PM2 and connect to at least one of the conductive traces. In some embodiments, as shown in FIG. 1A, the ground plane GP is closer to the overlying encapsulant MC2 and conductive columns CL2 than the redistribution elements RE. In alternative embodiments, the ground plane GP is more distant from the overlying encapsulant MC2 and conductive columns CL2 than the redistribution elements RE. The ground plane GP is electrically grounded, and connected to some of the conductive columns CL2 connected to the conductive pads PD1 through the conductive patterns CP1 and the conductive columns CL1 in between. In this way, resonance can be generated between the antennas AP and the ground plane GP, and the conductive pads PD1 as well as the conductive columns CL1 connected to the ground plane GP can block coupling between antennas AP. In some embodiments, the ground plane GP is connected to these conductive columns CL2 through conductive vias CV2. In addition, in some embodiments, additional routing structures RS may be connected between the redistribution elements RE and others of the conductive columns CL2 connected to the antennas AP through the conductive patterns CP1 and the conductive columns CL1 in between. In these embodiments, these routing structures RS penetrate through the ground plane GP. Moreover, a portion of these routing structures RS may spread at the same height as the ground plane GP, and the ground plane GP may have openings in which this portion of the routing structures RS spreads. Therefore, the ground plane GP can be electrically isolated from the routing structures RS. At the bottom side of the redistribution structure RDL2, the device die 100 may be attached to some of the bottommost redistribution elements RE via solder joints SJ, and an underfill UF may be formed to laterally surround the solder joints SJ. In some embodiments, the device die 100 may be attached to the redistribution structure RDL2 by a flip chip bonding manner, and an active side of the device die 100 is facing toward the redistribution structure RDL2. In addition, electrical connectors EC may be attached to others of the bottommost redistribution elements RE, and the device die 100 is located between adjacent ones of the electrical connectors EC. For instance, the electrical connectors EC may include bumps, controlled collapse chip connection (C4) bumps, ball grid array (BGA) balls or the like.

Referring to FIG. 1A and FIG. 1D, in some embodiments, the ground plane GP has slots SL that are laterally separated from one another and filled by one of the polymer layers PM2. By having the ground plane GP formed with the slots SL, metal density of the redistribution structure RDL2 can be decreased. In this way, warpage and/or lamination issues of the semiconductor package 10 can be suppressed. In some embodiments, the slots SL are located in a peripheral region of the ground plane GP, and laterally surround the overlying conductive columns CL2. However, those skilled in the art may adjust location and pattern of the slots SL according to process requirements, the present disclosure is not limited thereto.

FIG. 2A, FIG. 2C, FIG. 2E, FIG. 2G and FIG. 2I are schematic cross-sectional views illustrating passive filters according to some embodiments of the present disclosure. FIG. 2B, FIG. 2D, FIG. 2F, FIG. 2H and FIG. 2J are schematic plane view of the passive filter as shown in FIG. 2A, FIG. 2C, FIG. 2E, FIG. 2G and FIG. 2I, respectively.

Figure 2A:
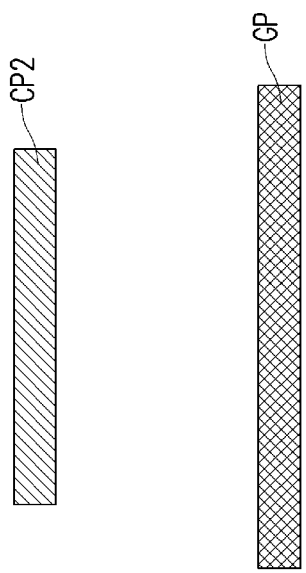
Figure 2B:
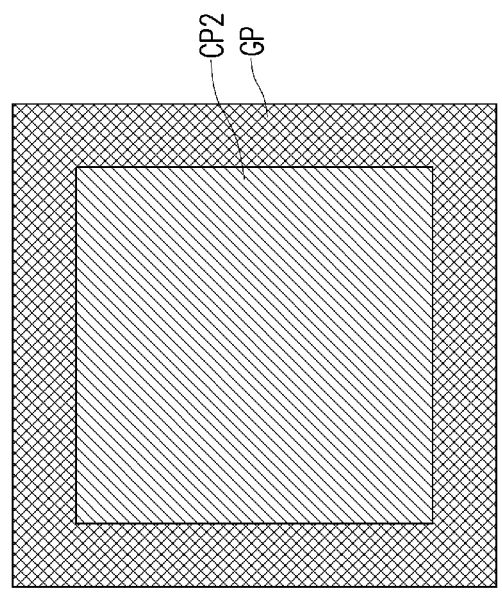
FIG. 2B, FIG. 2D, FIG. 2F, FIG. 2H and FIG. 2J are schematic plane views of the passive filter as shown in FIG. 2A, FIG. 2C, FIG. 2E, FIG. 2G and FIG. 2I, respectively.

Referring to FIG. 1A, FIG. 2A and FIG. 2B, in some embodiments, each of the EBG structures PF includes one of the conductive patterns CP2 (i.e. the conductive patterns CP not connected to the antennas AP nor the conductive pads PD1) and a portion of the ground plane GP overlapped with this conductive pattern CP2. This conductive pattern CP2 and this portion of the ground plane GP along with a portion of the polymer layer PM2 in between can be regarded as a capacitor. In addition, an equivalent circuit of this conductive pattern CP2 under high frequency may include an inductor or multiple inductors connected with one another. As described above, the ground plane GP is electrically grounded. On the other hand, in the embodiments shown in FIG. 2A and FIG. 2B, the conductive patterns CP2 are electrically floated.

Figure 2C:
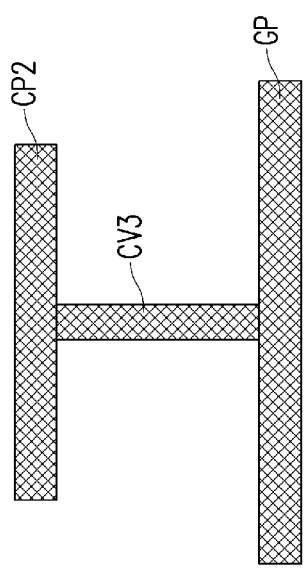
Figure 2D:
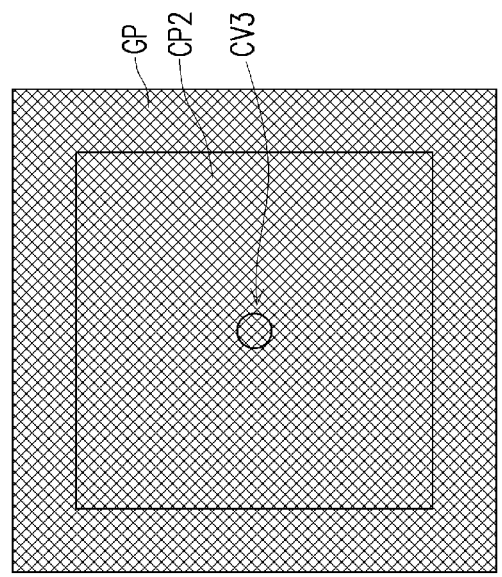

Referring to FIG. 2C and FIG. 2D, difference between the passive filter PF shown in FIG. 2C, FIG. 2D and the passive filter PF shown in FIG. 2A, FIG. 2B lies in that the passive filter PF shown in FIG. 2C and FIG. 2D further includes an additional conductive via CV3 connected between the conductive pattern CP2 and the ground plane GP. The conductive via CV3 may be formed in the encapsulant MC2 along with the conductive columns CL2. An equivalent circuit of the conductive pattern CP2, the additional conductive via CV3 and the ground plane GP under high frequency includes an inductor. In addition, overlapped portions of the conductive pattern CP2 and the ground plane GP may be capacitively coupled with each other under high frequency, and may be functioned as a capacitor along with a portion of the polymer layer PM2 in between.

Figure 2E:
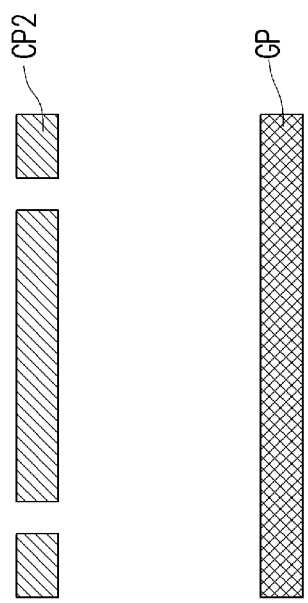
Figure 2F:
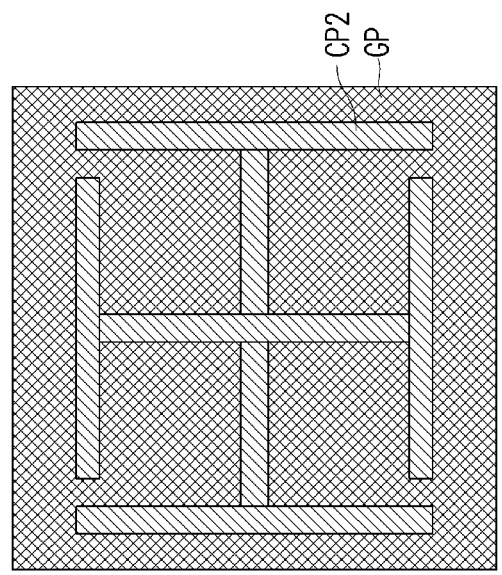

Referring to FIG. 2E and FIG. 2F, difference between the passive filter PF shown in FIG. 2E, FIG. 2F and the passive filter PF shown in FIG. 2A, FIG. 2B lies in that the conductive pattern CP2 of the passive filter PF shown in FIG. 2E, FIG. 2F is formed as multiple stripes, rather than being formed as a patch. Some of these stripes are intersected with each other, and surrounded by others of the stripes. For instance, as shown in FIG. 2F, two of the stripes are intersected with and perpendicular to each other, and surrounded by other four of the stripes. In addition, these surrounding stripes are connected to the central stripes, but may not be directly connected with each other. In other words, the surrounding stripes may be formed as an open ring, such as a rectangular open ring. In these embodiments, the conductive pattern CP2 may be functioned as an inductor under high frequency, and the conductive pattern CP2, an overlapped portion of the ground plane GP and a portion of the polymer layer PM2 in between may be functioned as a capacitor.

Figure 2G:
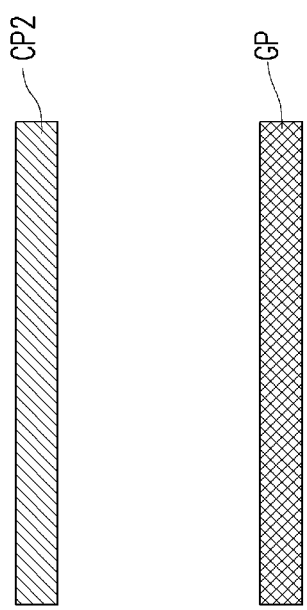
Figure 2H:
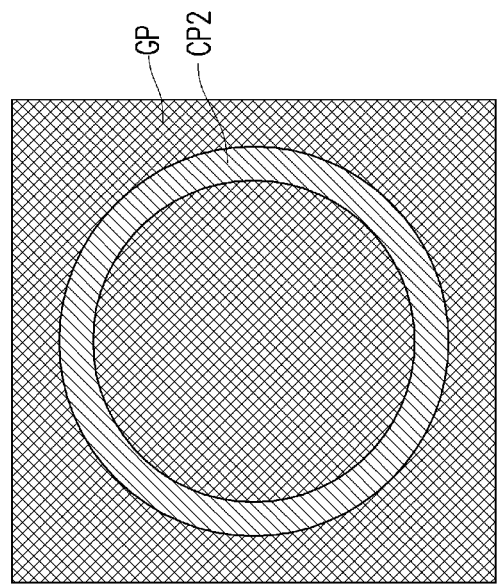
Figure 21:
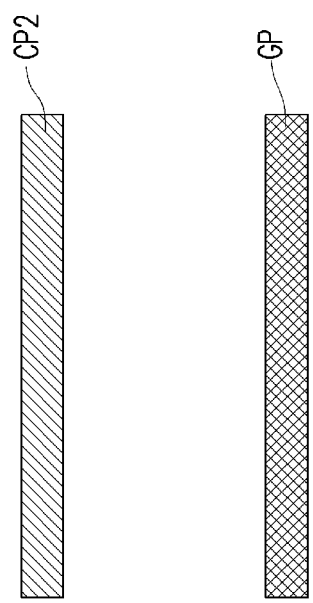

Referring to FIG. 2G and FIG. 2H, difference between the passive filter PF shown in FIG. 2G, FIG. 2H and the passive filter PF shown in FIG. 2E, FIG. 2F lies in that the conductive pattern CP2 of the passive filter PF shown in FIG. 2G, FIG. 2H is formed as a close ring. For instance, as shown in FIG. 2H, the conductive pattern CP2 is formed as a circular close ring. In these embodiments, a current loop may by induced on the ground plane GP by the conductive pattern CP2 under high frequency, and such current loop can be regarded as an inductor. In addition, different portions of the conductive pattern CP2 can be capacitively coupled to each other as a result of having different electrical potentials under high frequency.

Figure 2J:
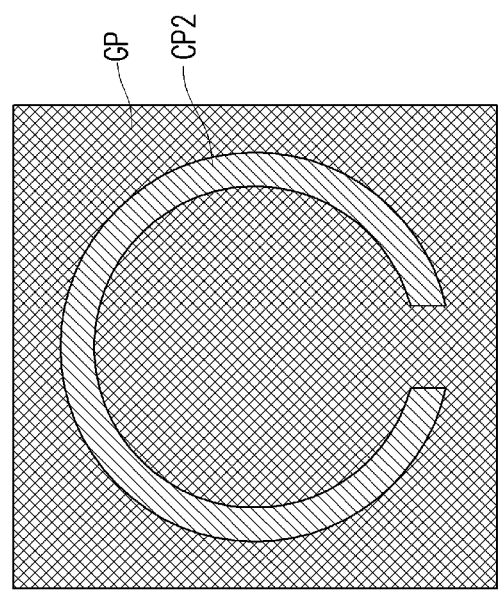

Referring to FIG. 2I and FIG. 2J, difference between the passive filter PF shown in FIG. 2I, FIG. 2J and the passive filter PF shown in FIG. 2G, FIG. 2H lies in that the conductive pattern CP2 of the passive filter PF shown in FIG. 2I, FIG. 2J is formed as an open ring. For instance, as shown in FIG. 2J, the conductive pattern CP2 is formed as a circular open ring. In these embodiments, an equivalent circuit of the conductive pattern CP2 under high frequency may also include an inductor, and portions of the conductive pattern CP2 spaced apart by the opening (where the conductive pattern CP2 is discontinuous) may be capacitively coupled with each other as a result of having different electrical potentials under high frequency.

Figure 3:
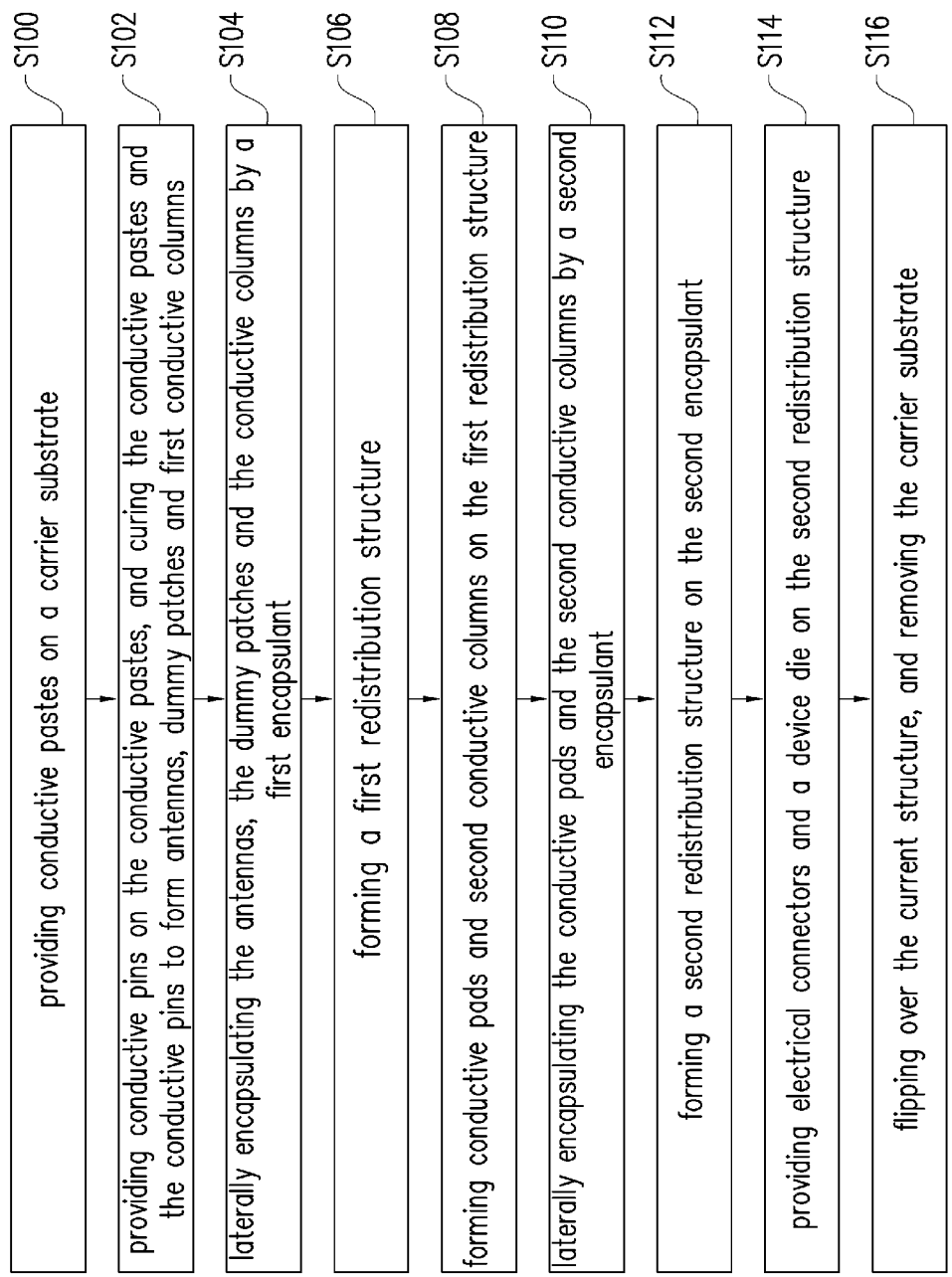
FIG. 3 is a flow diagram illustrating a manufacturing method of a semiconductor package according to some embodiments of the present disclosure.

FIG. 3 is a flow diagram illustrating a manufacturing method of the semiconductor package 10 according to some embodiments of the present disclosure. FIG. 4A through FIG. 4H are schematic cross-sectional views illustrating structures at various stages during the manufacturing method shown in FIG. 3.

Figure 4A:
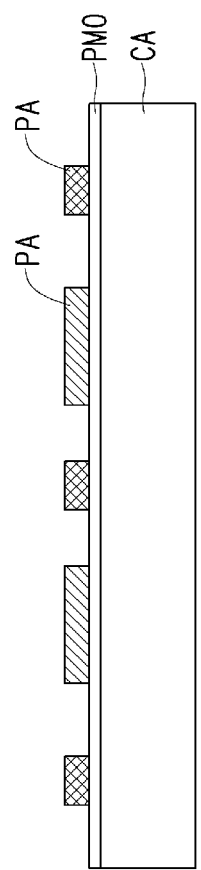
FIG. 4A through FIG. 4H are schematic cross-sectional views illustrating structures at various stages during the manufacturing method shown in FIG. 3.

Referring to FIG. 3 and FIG. 4A, step S100 is performed, and conductive pastes PA for forming the antennas AP and the conductive pads PD1 as shown in FIG. 1A are provided over a carrier substrate CA. The carrier substrate CA is, for example, a glass substrate. In some embodiments, the polymer layer PM0 is formed on the carrier substrate CA before formation of the conductive pastes PA, and may be functioned as an adhesive layer. In addition, in some embodiments, a method for providing the conductive pastes PA may include a stencil printing process. In these embodiments, a first stencil (not shown) having apertures is provided on the carrier substrate CA, then a squeegee (also not shown) may be used for rolling a conductive paste material to fill the apertures of the first stencil. Subsequently, the first stencil is removed, and remained portions the conductive paste material form the conductive pastes PA as shown in FIG. 4A.

Figure 4B:
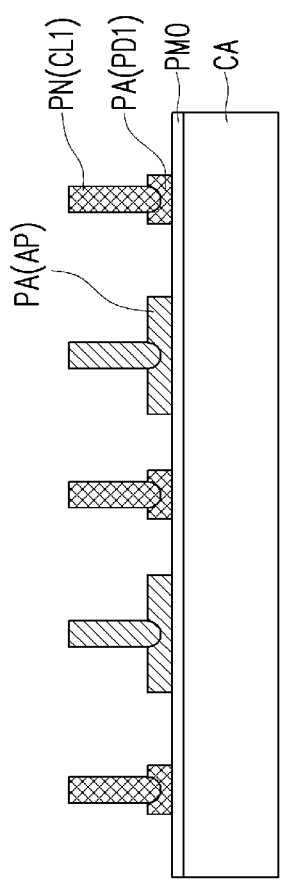

Referring to FIG. 3 and FIG. 4B, step S102 is performed, and conductive pins PN for forming the conductive columns CL1 as shown in FIG. 1A are provided on the conductive pastes PA, respectively. The conductive pins PN are respectively standing on one of the conductive pastes PA. In some embodiments, a method for providing the conductive pins PN includes providing a second stencil (not shown) on the structure shown in FIG. 4A. This second stencil has apertures respectively exposing a portion of one of the conductive pastes PA. Thereafter, plenty of pre-fabricated conductive pins (not shown) are dispensed on this second stencil, and the second stencil along with these pre-fabricated conductive pins may be oscillated, such that some of these pre-fabricated conductive pins drop into the apertures of the second stencil and stand on the conductive pastes PA, respectively. Those pre-fabricated conductive pins standing one the conductive pastes PA form the conductive pins PN as shown in FIG. 4B. In certain cases, top surfaces of the conductive pastes PA may be recessed as a consequence of placement of these conductive pins PN. Subsequently, remainder of the pre-fabricated conductive pins and the second stencil are removed. Moreover, the conductive pastes PA as well as the conductive pins PN standing thereon are cured. The cured conductive pins PN form the conductive columns CL1 as shown in FIG. 1A. On the other hand, the cured conductive pastes PA form the antennas AP and the conductive pads PD1 as shown in FIG. 1A.

Figure 4C:
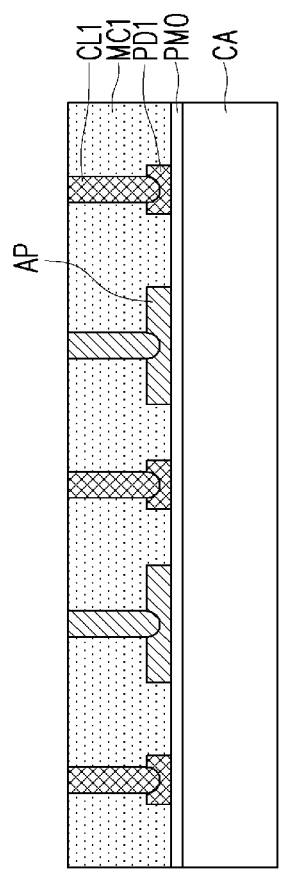

Referring to FIG. 3 and FIG. 4C, step S104 is performed, and the antennas AP, the conductive pads PD1 and the conductive columns CL1 are encapsulated by the encapsulant MC1. In some embodiments, the antennas AP, the conductive pads PD1 and the conductive columns CL1 are over-molded by an encapsulant material (not shown), then a top portion of this encapsulant material is removed to expose top surfaces of the conductive columns CL1 by a planarization process, so as to form the encapsulant MC1. For instance, the planarization process may include a chemical mechanical polishing process, a grinding process, an etching process or a combination thereof.

Figure 4D:
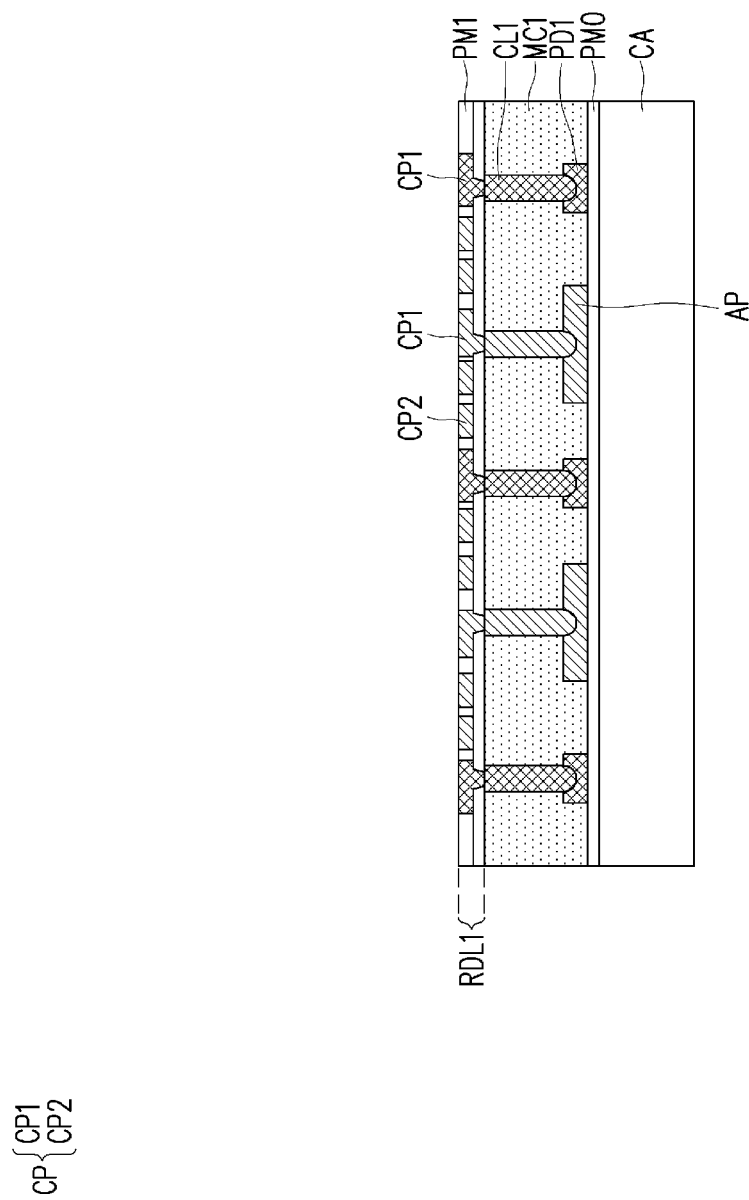

Referring to FIG. 3 and FIG. 4D, step S106 is performed, and the redistribution structure RDL1 is formed over the current structure. In some embodiments, one of the polymer layers PM1 may be initially formed, then openings are formed in this polymer layer PM1 by an etching process, a lithography process or a combination thereof. Subsequently, the conductive vias CV1 are filled in these openings, and the conductive patterns CP are formed over the conductive vias CV1. A method for forming the conductive vias CV1 and the conductive patterns CP may include a lithography process as well as a plating process, a deposition process or a combination thereof. Thereafter, another one of the polymer layers PM1 is formed to laterally surround the conductive patterns CP. A method for forming this upper polymer layer PM1 may include initially forming a polymer material layer (not shown) to cover the lower polymer layer PM1 and the conductive patterns CP, and removing portions of this polymer material layer over the conductive patterns CP. The remained portion of the polymer material layer forms the upper polymer layer PM1. Although not shown, additional signal lines and additional polymer layers may be formed in the redistribution structure RDL1, and these additional signal lines and the additional polymer layer may be located over or below the conductive patterns CP. A method for forming these additional signal lines may be similar to the method for forming the polymer layers PM1, the conductive vias CV1 and the conductive patterns CP, and it will not be repeated again.

Figure 4E:
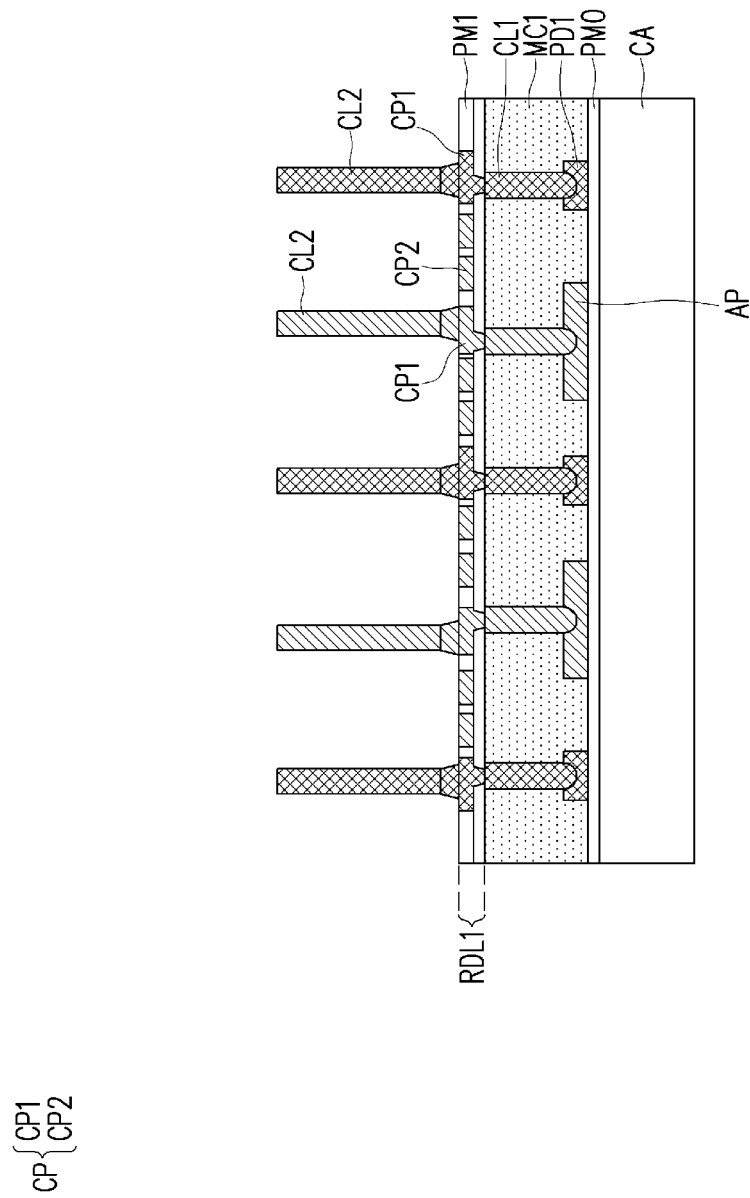

Referring to FIG. 3 and FIG. 4E, step S108 is performed, and conductive pads PD2 as well as the conductive columns CL2 are formed on the current structure. The conductive pads PD2 are formed on some of the conductive patterns CP (i.e., the conductive patterns CP1 as described with reference to FIG. 1A), and the conductive columns CL2 are standing on the conductive pads PD2, respectively. A method for forming the conductive pads PD2 may be similar to a method for forming the antennas AP and the conductive pads PD1 as described with reference to FIG. 4A and FIG. 4B, and a third stencil (not shown) may be used. A material of the conductive pads PD2 may include a solder material. After formation of the conductive pads PD2, the conductive columns CL2 may be formed by using a method similar to the method for forming the conductive columns CL1 as described with reference to FIG. 4B, and a fourth stencil (not shown) may be used. In certain embodiments, materials for forming the conductive pads PD2 and the conductive columns CL2 may be cured at the same time, and top surfaces of the conductive pads PD2 may be recessed (not shown) as a consequence of formation of the overlying conductive columns CL2.

Figure 4F:
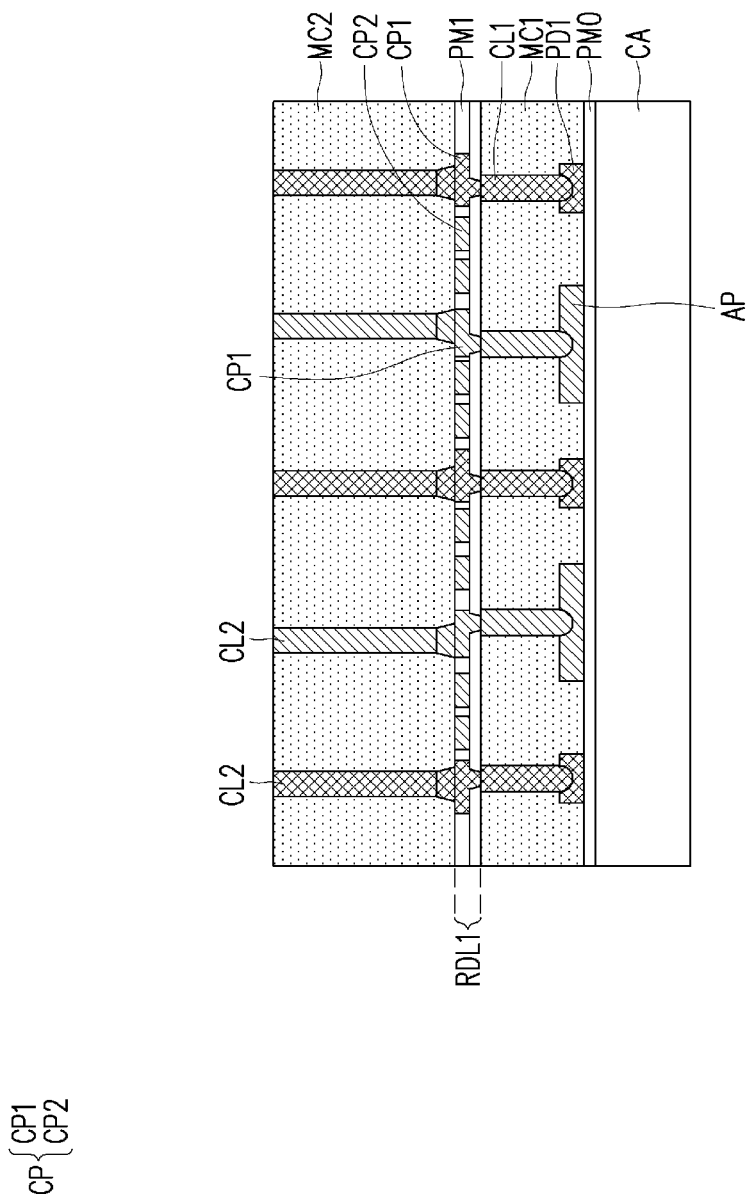

Referring to FIG. 3 and FIG. 4F, step S110 is performed, and the conductive pads PD2 as well as the conductive columns CL2 are encapsulated by the encapsulant MC2. In some embodiments, the conductive pads PD2 and the conductive columns CL2 are over-molded by an encapsulant material (not shown), then a top portion of this encapsulant material is removed by a planarization process. The planarization process is performed till top surfaces of the conductive columns CL2 are exposed, and the remained portion of the encapsulant material forms the encapsulant MC2. For instance, the planarization process may include a chemical mechanical polishing process, a grinding process, an etching process or a combination thereof.

Figure 4G:
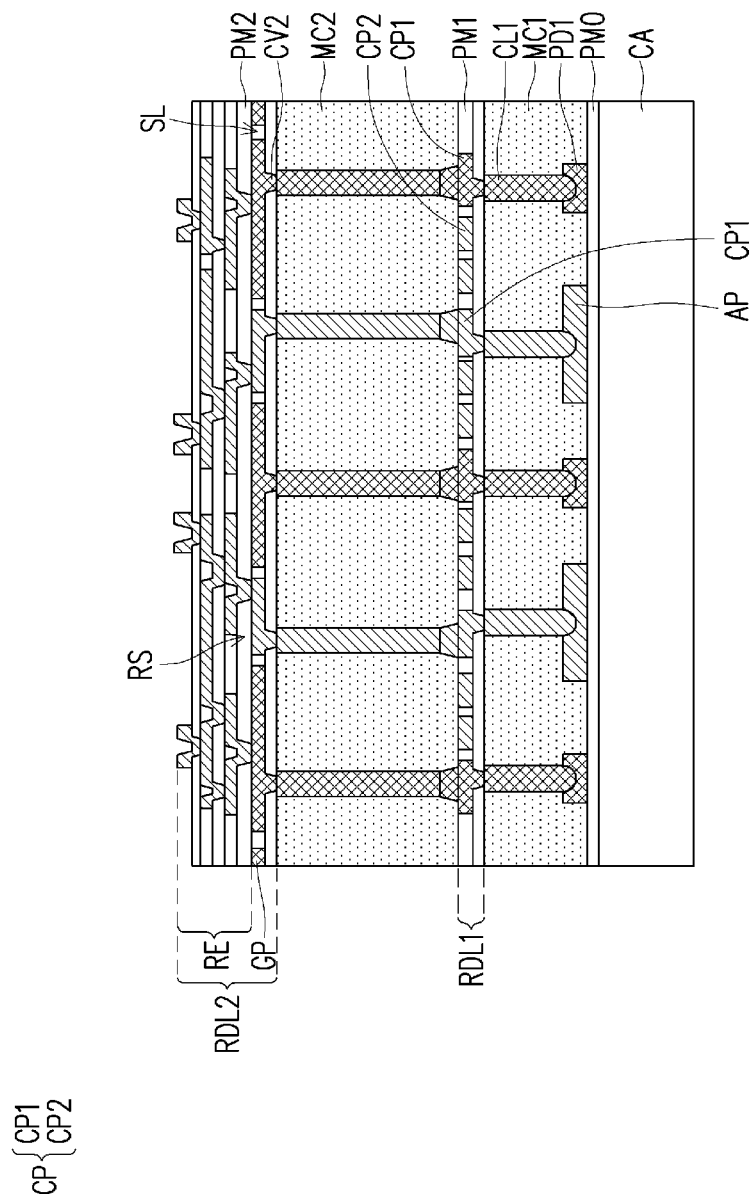

Referring to FIG. 3 and FIG. 4G, step S112 is performed, and the redistribution structure RDL2 is formed over the current structure. A method for forming every two of the polymer layers PM2 and conductive components therein may be similar to the method for forming the polymer layers PM1, the conductive vias CV1 and the conductive patterns CP as described with reference to FIG. 4D. After repeating multiple times of such method, the stack of polymer layers PM2 except for the topmost one may be formed, along with the conductive components in these polymer layers PM2 (e.g., the conductive vias CV2, the ground plane GP, portions of the redistribution elements RE and other possible conductive components). Subsequently, the topmost polymer layer PM2 may be formed, and openings may be formed in this topmost polymer layer PM2 by a lithography process, an etching process or a combination thereof. Thereafter, the topmost redistribution elements RE may be formed in these openings, and may extend onto a top surface of the topmost polymer layer PM2. The topmost redistribution elements RE may be functioned as under bump metallization (UBM) layers, and may or may not be formed of a material different from a material of other redistribution elements RE.

Figure 4H:
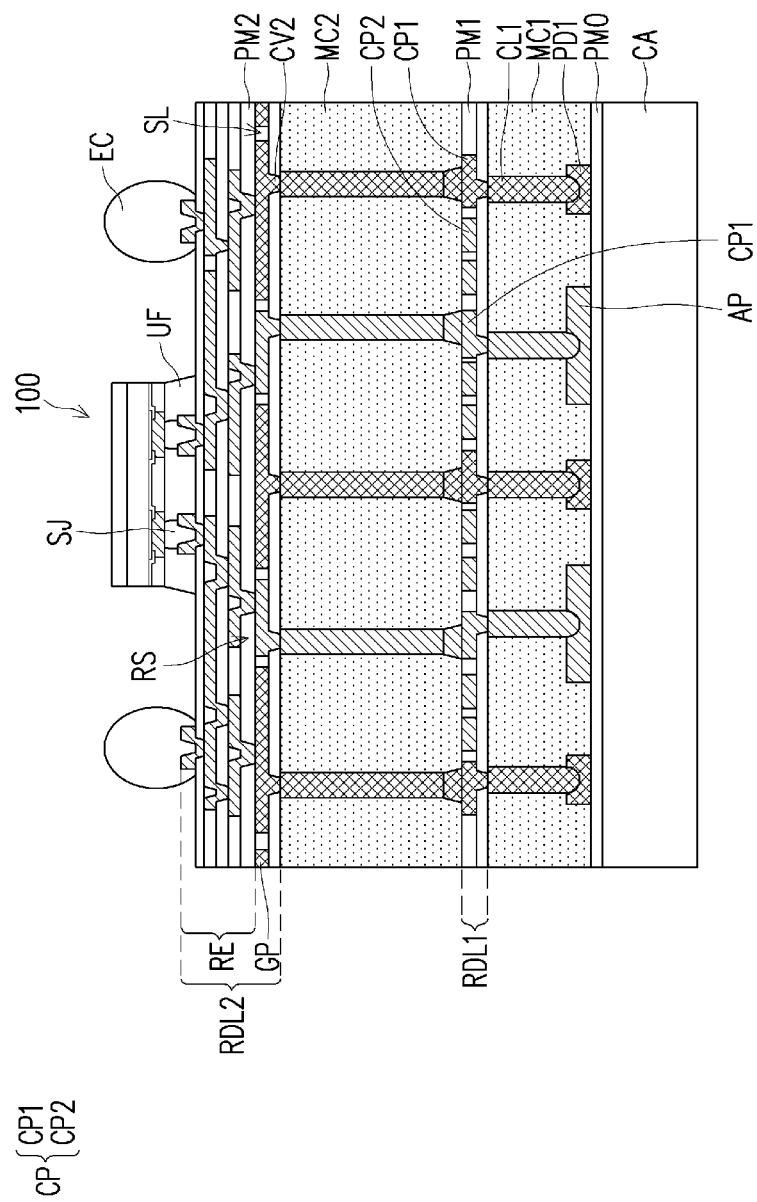

Referring to FIG. 3 and FIG. 4H, step S114 is performed, and the electrical connectors EC and the device die 100 are provided on the topmost redistribution elements RE. In some embodiments, the electrical connectors EC are provided on some of the topmost redistribution elements RE by a ball placement process and a reflow process. On the other hand, the device die 100 is attached onto others of the topmost redistribution elements RE by, for example, a flip chip bonding manner. In some embodiments, the device die 100 is pre-formed as having the solder joints SJ at an active side of the device die 100, and the device die 100 is attached to redistribution structure RDL2 through the solder joints SJ. After attaching the device die 100 to the redistribution structure RDL2, the underfill UF may be provided to laterally surround the solder joints SJ. The attached device die 100 may be located between adjacent electrical connectors EC. In some embodiments, a height of the solder joints SJ is less than a height of the electrical connectors EC, and a total height of the device die 100 may or may not be less than the height of the electrical connectors EC.

Referring to FIG. 3 and FIG. 1A, step S116 is performed, and the carrier substrate CA is removed. In some embodiments, the structure shown in FIG. 4H is flipped over and subjected to a frame mount process before removal of the carrier substrate CA. Thereafter, the carrier substrate CA is debonded from the structure attached thereto, and this structure may be subjected to a singulation process. The semiconductor package 10 as shown in FIG. 1A may be one of the singulated structures.

Figure 5:
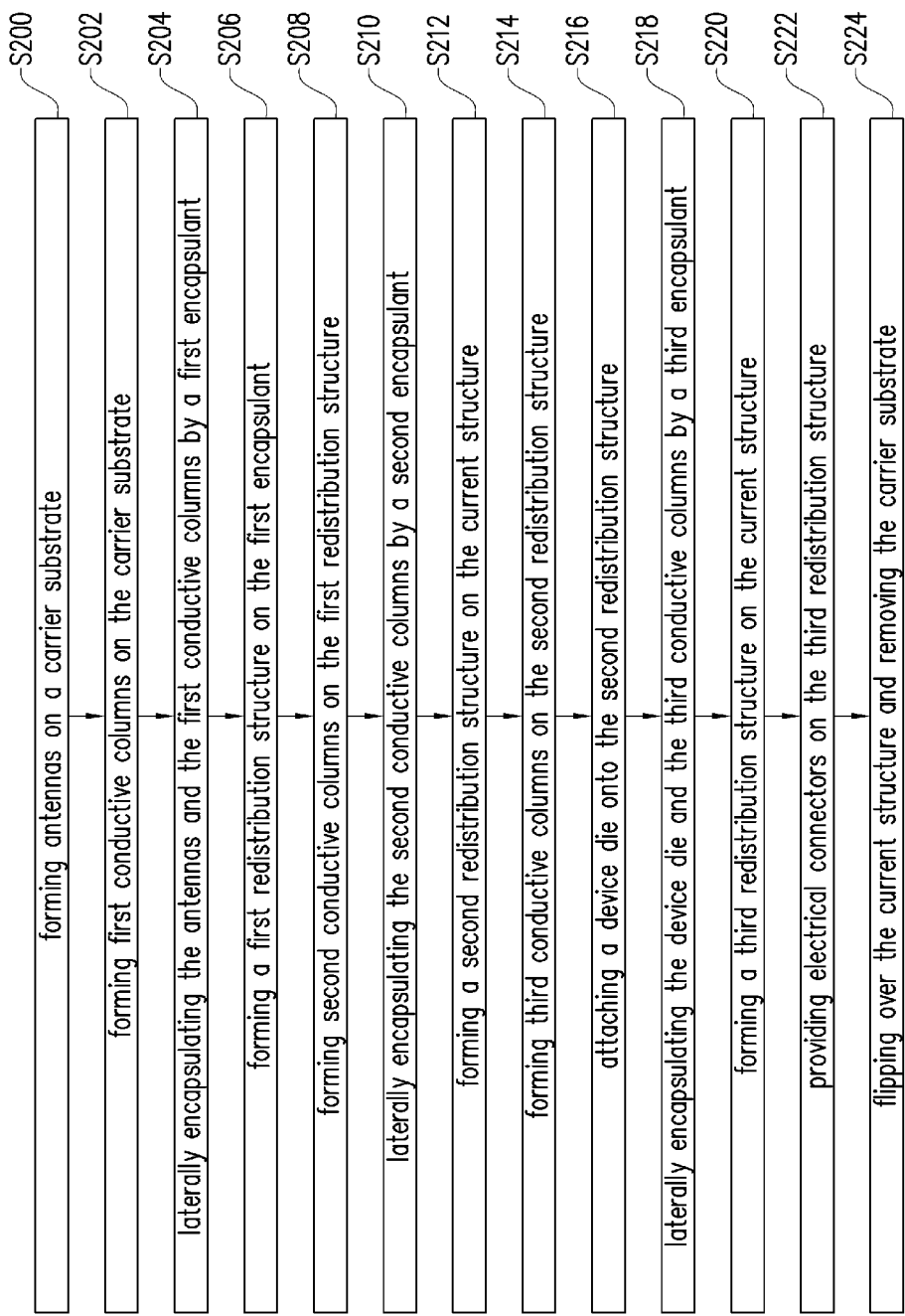
FIG. 5 is a flow diagram illustrating a manufacturing method of a semiconductor package according to some embodiments of the present disclosure.

FIG. 5 is a flow diagram illustrating a manufacturing method of a semiconductor package 20 according to some embodiments of the present disclosure. FIG. 6A through FIG. 6M are schematic cross-sectional views illustrating structures at various stages during the manufacturing method shown in FIG. 5.

Figure 6A:
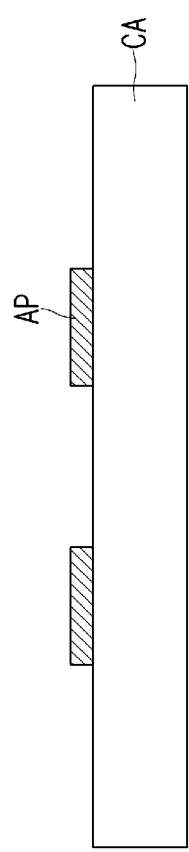
Figure 6B:
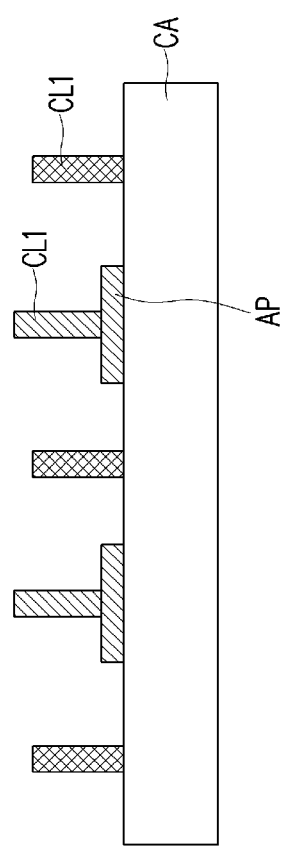
Figure 6C:
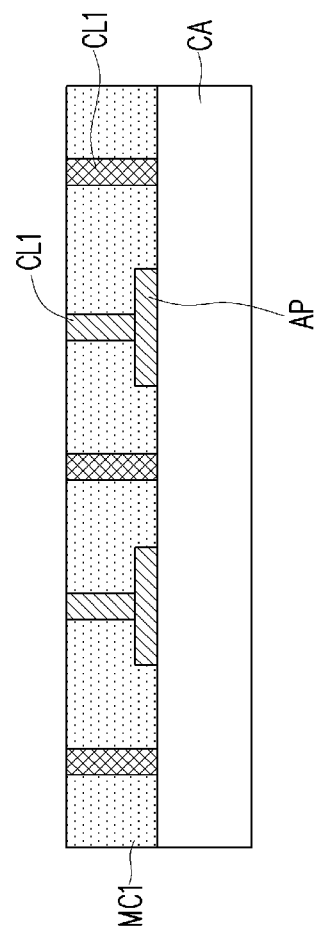
Figure 6D:
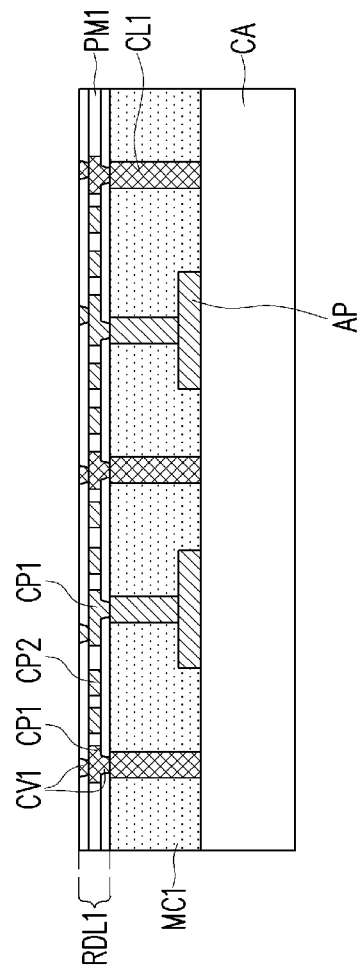
Figure 6E:
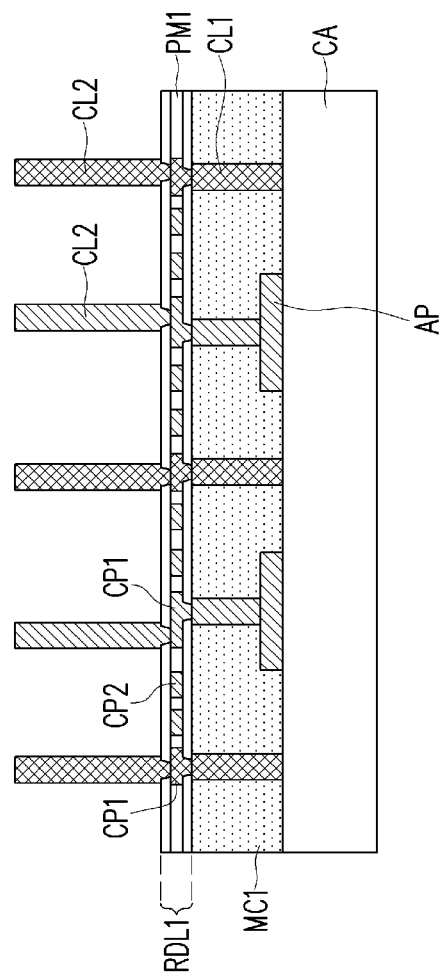
Figure 6F:
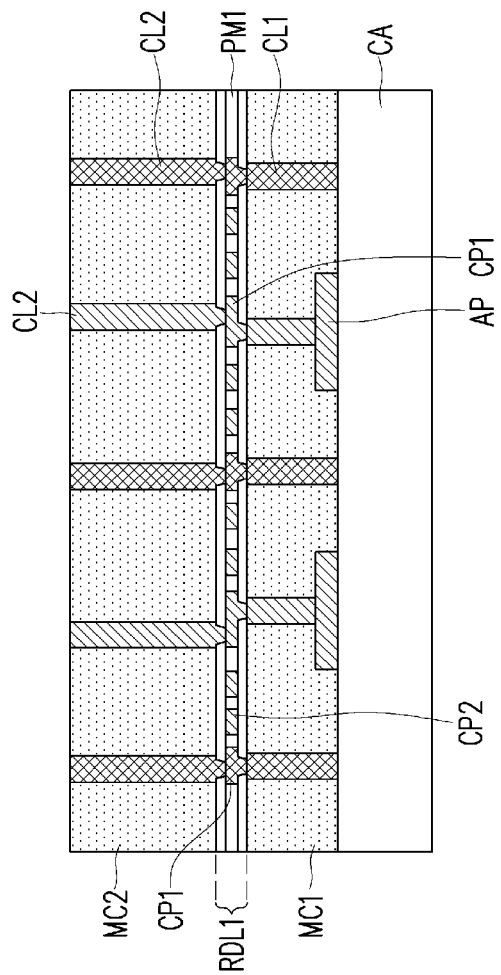
Figure 6G:
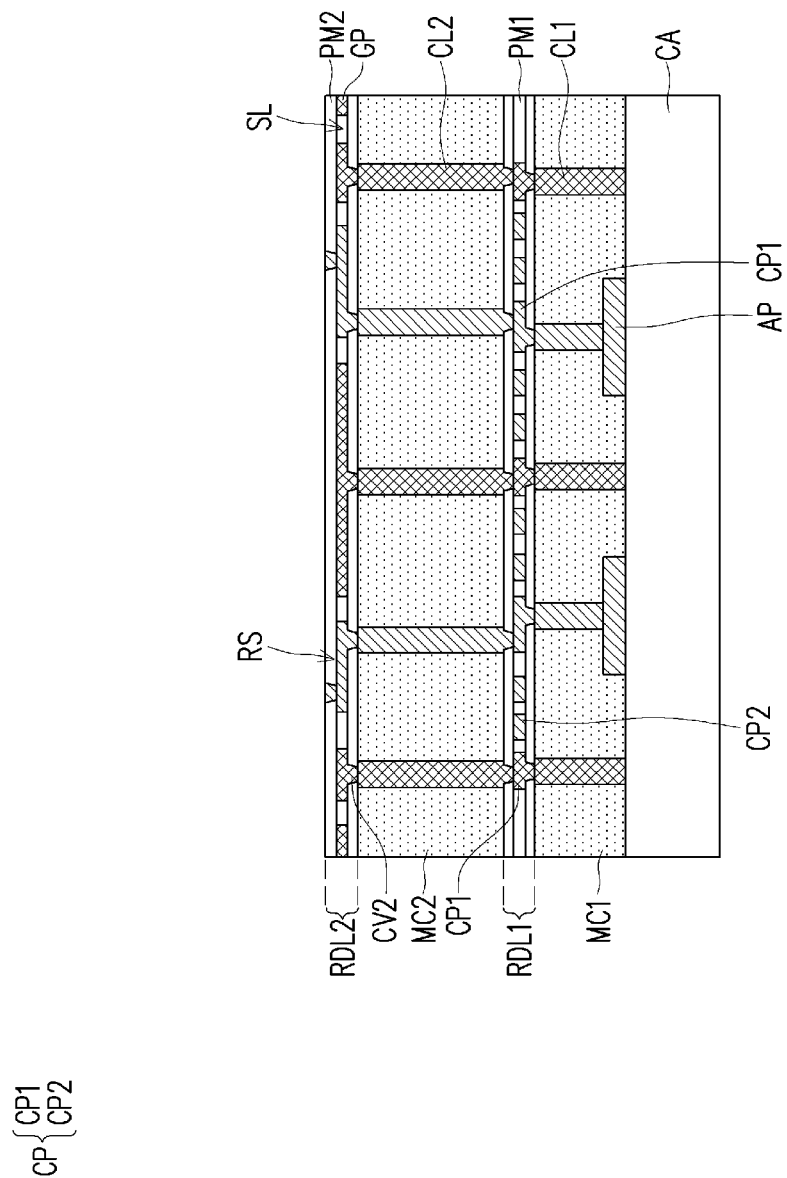
Figure 6H:
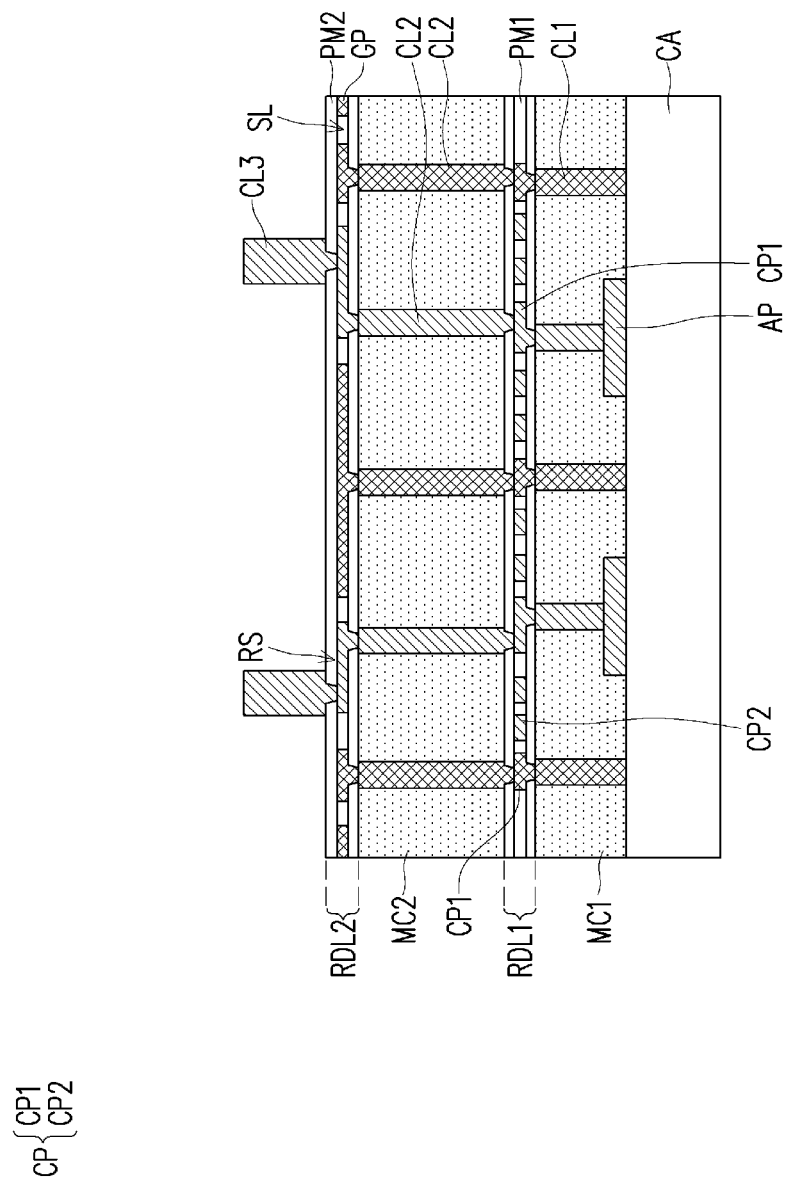
Figure 61:
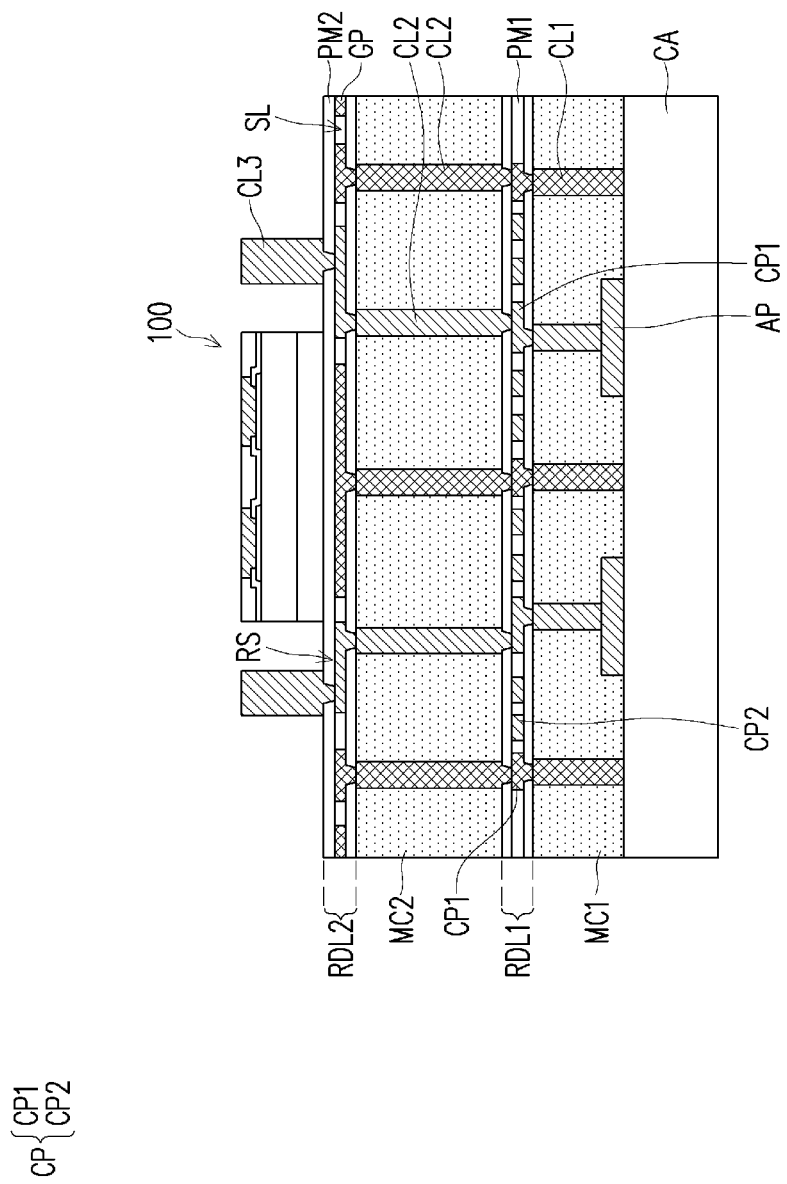
Figure 6J:
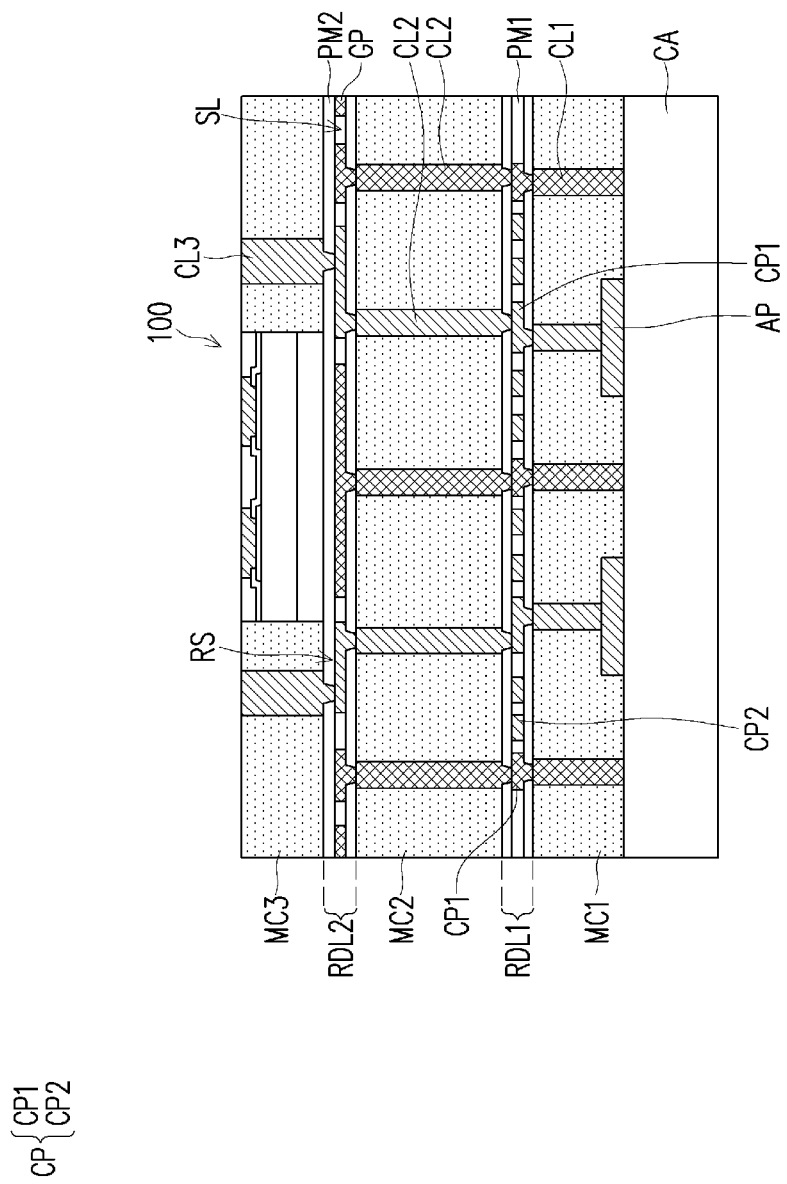
Figure 6K:
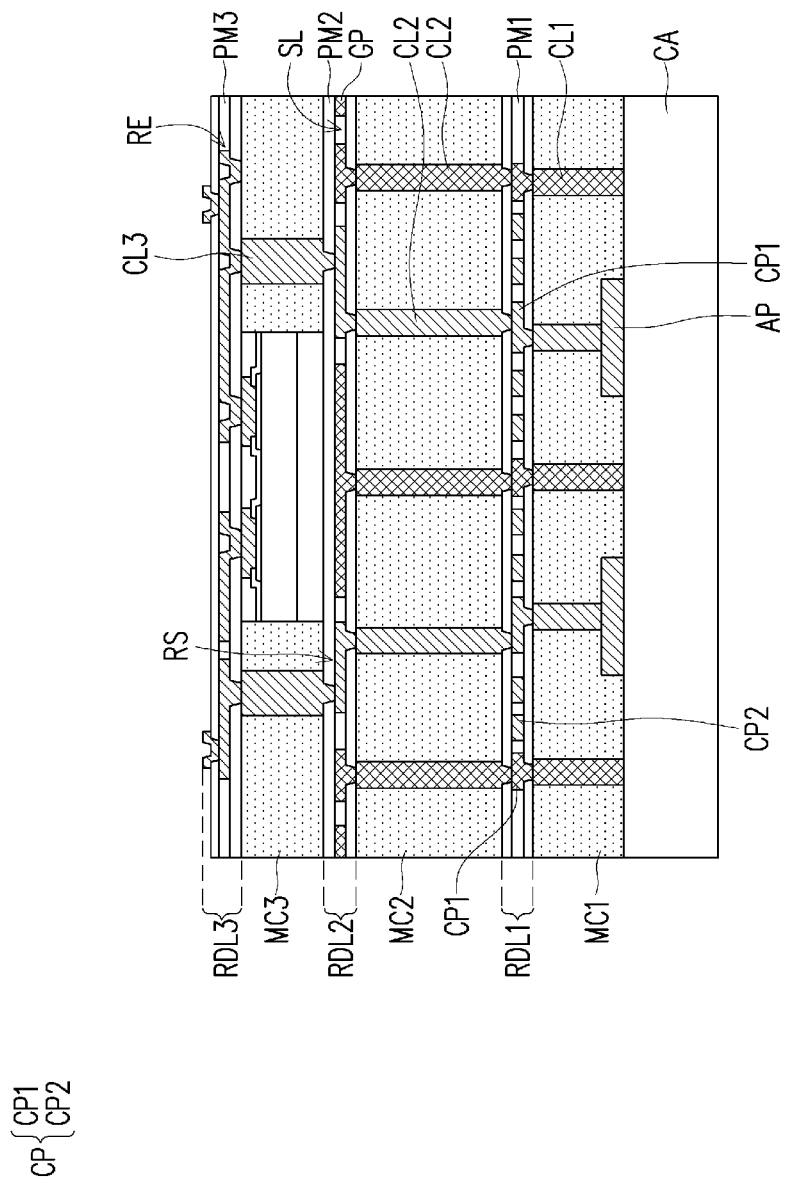
Figure 6L:
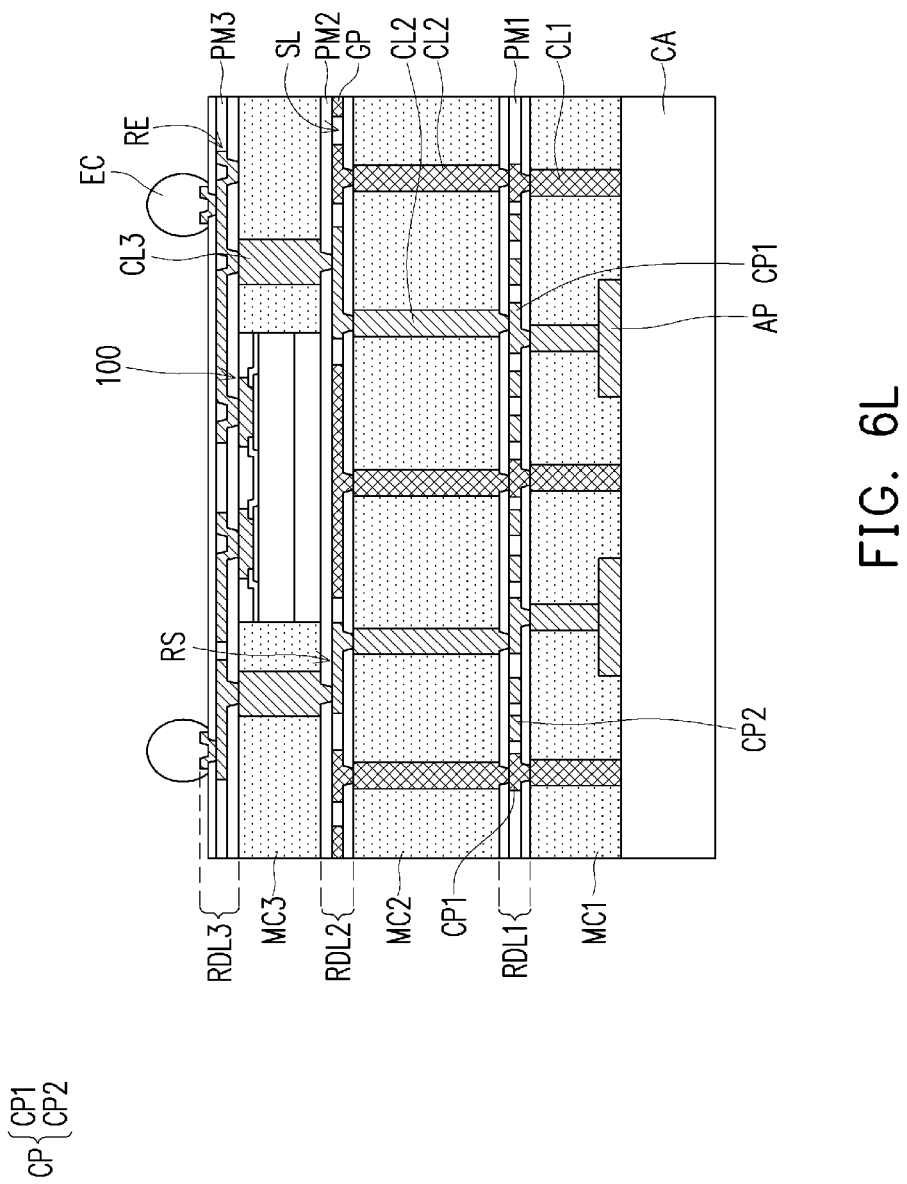
Figure 6M:
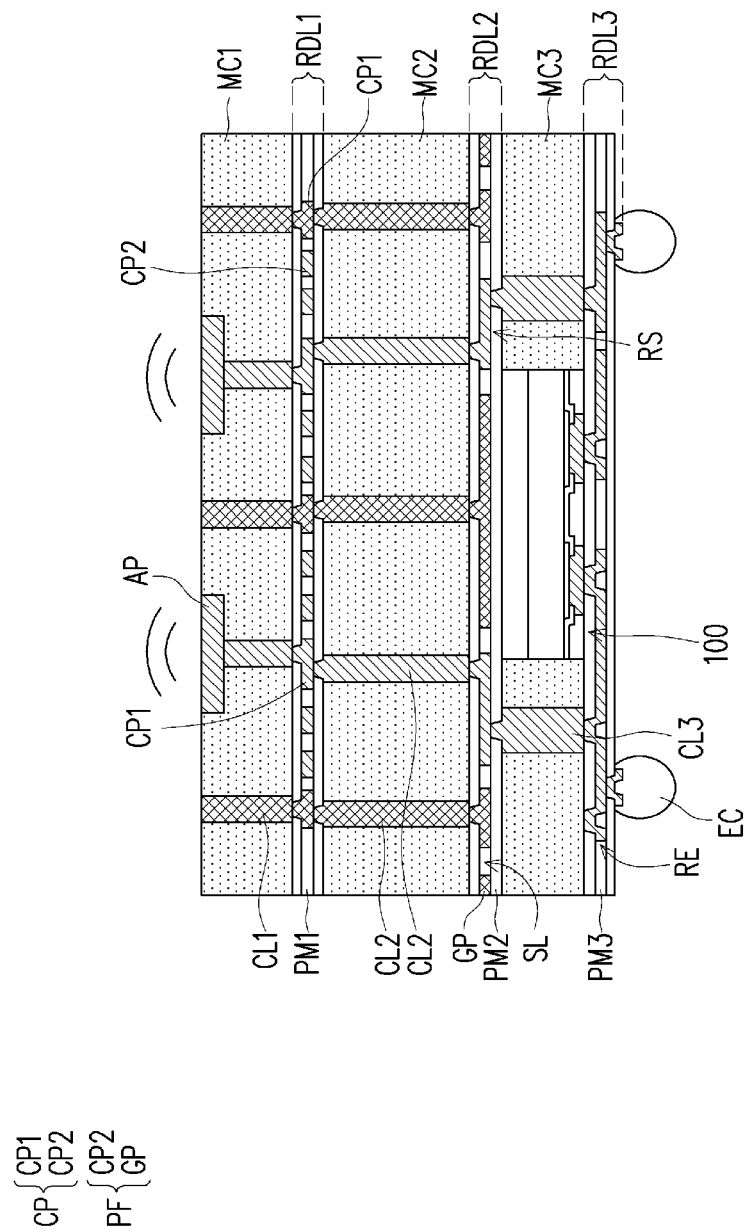

The semiconductor package 20 (as shown in FIG. 6M) and a manufacturing method thereof (as shown in FIG. 5 and FIG. 6A through FIG. 6M) are similar to the semiconductor package 10 (shown in FIG. 1A) and the manufacturing method thereof (as shown in FIG. 3 and FIG. 4A through FIG. 4H). Only differences therebetween will be discussed, the same or the like parts would not be repeated again. A major difference between the semiconductor package 10 shown in FIG. 1A and the semiconductor package 20 shown in FIG. 6M lies in that the device die 100 in the semiconductor package 20 is laterally encapsulated by an additional encapsulant MC3 (as shown in FIG. 6M), rather than being attached at a bottom surface of the redistribution structure RDL2 (as shown in FIG. 1A). According to some embodiments, the manufacturing method of the semiconductor package 20 includes the following steps.

Referring to FIG. 5 and FIG. 6A, step S200 is performed, and the antennas AP are formed on the carrier substrate CA. According to some embodiments, the conductive pads PD1 as shown in FIG. 4A are omitted herein. In addition, the polymer layer PM0 as shown in FIG. 4A may also be omitted herein. A method for forming the antenna AP may include a lithography process as well as a plating process, a deposition process or a combination thereof. Alternatively, the antennas AP may be formed by a stencil printing process as described with reference to FIG. 4A.

Referring to FIG. 5 and FIG. 6B, step S202 is performed, and the conductive columns CL1 are formed. In some embodiments, the conductive columns CL1 currently have substantially identical height. In these embodiments, top surfaces of some of the conductive columns CL1 standing on the antennas AP may be higher than top surfaces of others of the conductive columns CL1 standing aside the antennas AP. A method for forming the conductive columns CL1 may include a lithography process as well as a plating process, a deposition process or a combination thereof.

Referring to FIG. 5 and FIG. 6C, step S204 is performed, and the antennas AP as well as the conductive columns CL1 are encapsulated by the encapsulant MC1. In some embodiments, the conductive columns CL1 and the antennas AP are over-molded by an encapsulant material (not shown), then a top portion of this encapsulant material along with top portions of the conductive columns CL1 standing on the antennas AP are removed by a planarization process. The planarization process may be performed till top surfaces of the conductive columns CL1 standing on the antennas AP and top surface of the conductive columns CL1 standing aside the antennas AP are both exposed. The remained portion of the encapsulant material forms the encapsulant MC1. In some embodiments, the top surfaces of the conductive columns CL1 standing on the antennas AP are substantially coplanar with a top surface of the encapsulant MC1 as well as the top surfaces of the conductive columns CL1 standing aside the antennas AP.

Referring to FIG. 5 and FIG. 6D, step S206 is performed, and the redistribution structure RDL1 is formed. In some embodiments, the conductive patterns CP in the redistribution structure RDL1 are further covered by an additional polymer layer PM1. In addition, additional conductive vias CV1 may be formed in the additional polymer layer CV1, and these additional conductive vias CV1 are standing on some of the conductive patterns CP connected to the underlying conductive columns CL1 (i.e., the conductive patterns CP1). In some embodiments, a method for forming the additional conductive vias CV1 in the additional polymer layer PM1 includes forming openings in the additional polymer layer PM1 by a lithography process, an etching process or a combination thereof, and filling a conductive material into these openings to form the additional conductive vias CV1. A planarization process may by further performed to remove portions of the conductive material over the additional polymer layer PM1. In those embodiments where additional signal lines (not shown) are formed in the redistribution structure RDL1, these signal lines may be spreading between the conductive patterns CP and the lower conductive vias CV1, or between the conductive patterns CP and the upper conductive vias CV1.

Referring to FIG. 5 and FIG. 6E, step S208 is performed, and the conductive columns CL2 are formed on the redistribution structure RDL1. In some embodiments, a method for forming the conductive columns CL1 may include a lithography process as well as a plating process, a deposition process or a combination thereof. In these embodiments, the conductive pads PD2 as shown in FIG. 4E may be omitted herein, such that the conductive columns CL2 may be connected to the redistribution structure RDL1 without a conductive pad in between.

Referring to FIG. 5 and FIG. 6F, step S210 is performed, and the conductive columns CL2 are laterally encapsulated by the encapsulant MC2. In some embodiments, the conductive columns CL2 may be initially over-molded by an encapsulant material (not shown), and a top portion of the encapsulant material may be removed to expose top surfaces of the conductive columns CL2. The remained portion of the encapsulant material forms the encapsulant MC2.

Referring to FIG. 5 and FIG. 6G, step S212 is performed, and the redistribution structure RDL2 are formed on the encapsulant MC2 and the conductive columns CL2. In some embodiments, the redistribution structure RDL2 includes the ground plane GP and the conductive vias CV2 connecting the ground plane GP to some of the underlying conductive columns CL2, and may further include some routing structures RS (e.g., including conductive traces and conductive vias) connecting to others of the conductive columns CL2 from above and partially spreading at the same height as the ground plane GP. In these embodiments, the ground plane GP may have openings in which a portion of the routing structures RS spreads, and is electrically isolated from the routing structures RS. A method for forming the redistribution structure RDL2 is similar to the method for forming the redistribution structure RDL1, and would not be repeated again.

Referring to FIG. 5 and FIG. 6H, step S214 is performed, and conductive columns CL3 are provided on the redistribution structure RDL2. The conductive columns CL3 are in contact with the topmost portions of the routing structures RS, and some of the conductive columns CL3 may be spaced apart that the device die 100 can be placed between these conductive columns CL3 in the following step (as shown in FIG. 6I). In some embodiments, the conductive columns CL3 are formed by a lithography process, as well as a deposition process, a plating process or a combination thereof. In alternative embodiments, the conductive columns CL3 are provided by a method similar to the method for providing the conductive columns CL2 as described with reference to FIG. 4E. In these alternative embodiments, conductive pads (similar to the conductive pads PD2 as described with reference to FIG. 4E) may be pre-formed on the redistribution structure RDL2, and the conductive columns CL3 may be in contact with the redistribution structure RDL2 through the conductive pads.

Referring to FIG. 5 and FIG. 6I, step S216 is performed, and the device die 100 is attached onto the redistribution structure RDL2. In some embodiments, an active side of the attached device die 100 faces away from the redistribution structure RDL2, whereas a back side of the attached device die 100 faces toward the redistribution structure RDL2. In addition, the device die 100 may not be in direct electrical contact with the routing structures RS in the redistribution structure RDL2. Instead, the device die 100 may be electrically connected to the routing structures RS through the subsequently formed redistribution structure (i.e., the redistribution structure RDL3 as shown in FIG. 6K) and the conductive columns CL3.

Referring to FIG. 5 and FIG. 6J, step S218 is performed, and the device die 100 as well as the conductive columns CL3 are laterally encapsulated by an encapsulant MC3. As similar to the description with reference to FIG. 6F, the device die 100 and the conductive columns CL3 herein may be initially over-molded by an encapsulant material (not shown), and a top portion of the encapsulant material may be removed to expose top surfaces of the device die 100 and the conductive columns CL3. The remained portion of the encapsulant material forms the encapsulant MC3.

Referring to FIG. 5 and FIG. 6K, step S220 is performed, and a redistribution structure RDL3 is formed on the current structure. The redistribution structure RDL3 includes a stack of polymer layers PM3, and includes redistribution elements RE formed in the stack of polymer layers PM3. The redistribution elements RE electrically connect the device die 100 to the conductive columns CL3, and out-rout the device die 100 to subsequently formed electrical connectors (i.e., the electrical connectors EC as shown in FIG. 6L). The redistribution elements RE may include conductive traces and conductive vias. The conductive traces respectively extend on one of the polymer layers PM3, whereas the conductive vias respectively penetrate through at least one of the polymer layers PM3, and connect to at least one of the conductive traces. In some embodiments, a method for forming the redistribution structure RDL3 is similar to the method for forming the redistribution structure RDL2 as described with reference to FIG. 4G, except that formation of the ground plane GP may be omitted herein. In addition, in some embodiments, the topmost redistribution elements RE may be functioned as under bump metallization (UBM) layers, and may or may not be formed of a material different from a material of other redistribution elements RE.

Referring to FIG. 5 and FIG. 6L, step S222 is performed, and electrical connectors EC are provided on the redistribution structure RDL3. In some embodiments, the electrical connectors EC are provided on the topmost redistribution elements RE by a ball placement process and a reflow process.

Referring to FIG. 5 and FIG. 6M, step S224 is performed, and the carrier substrate CA is removed. In some embodiments, the structure shown in FIG. 6L is flipped over and subjected to a frame mount process before removal of the carrier substrate CA. Thereafter, the carrier substrate CA is debonded from the structure attached thereto, and this structure may be subjected to a singulation process. The semiconductor package 20 as shown in FIG. 6M may be one of the singulated structures.

As shown in FIG. 6M, the ground plane GP and the redistribution elements RE are formed in the redistribution structure RDL2 and the redistribution structure RDL3, respectively. In addition, the device die 100 is encapsulated in the encapsulant MC3 between the redistribution structures RDL2, RDL3, and the conductive columns CL3 are formed in the encapsulant MC3 for establishing electrical connection between the redistribution structures RDL2, RDL3.

Figure 7A:
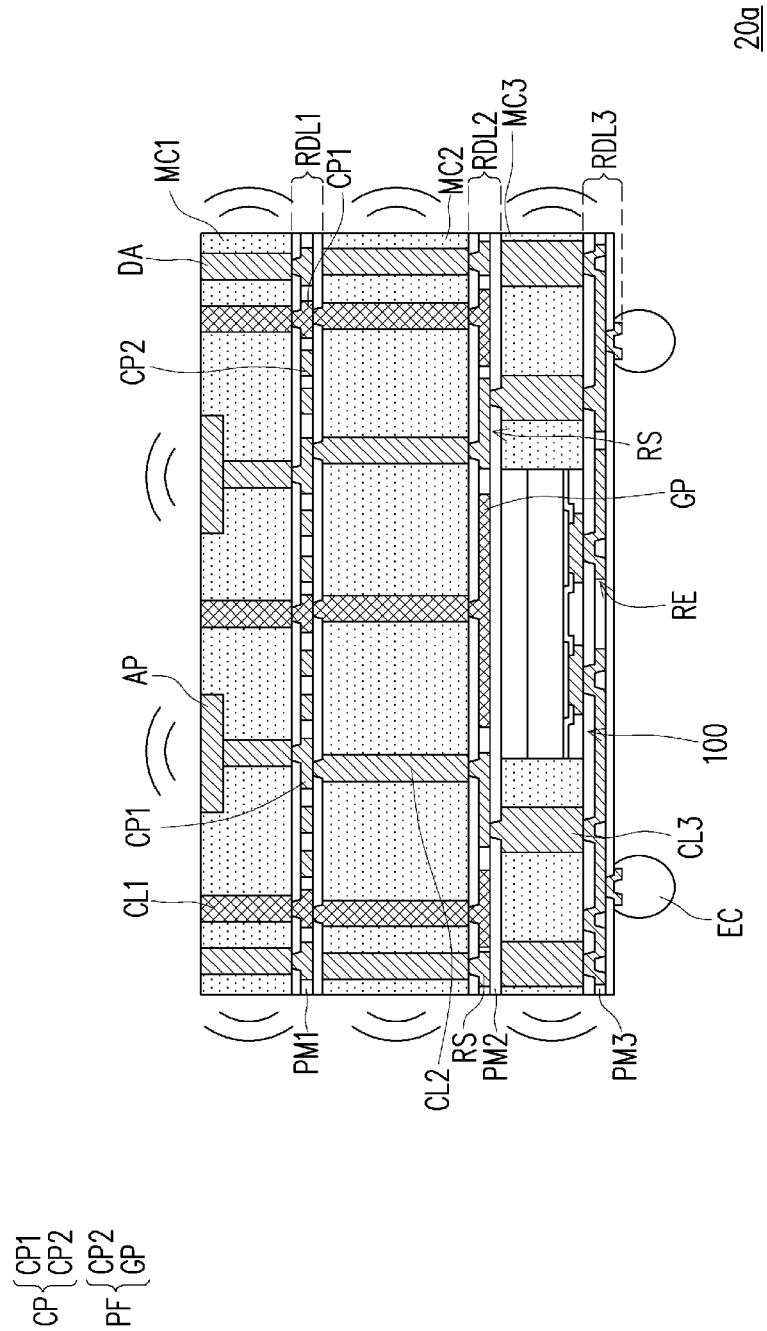
FIG. 7A is a schematic cross-sectional view illustrating a semiconductor package according to some embodiments of the present disclosure.
Figure 7B:
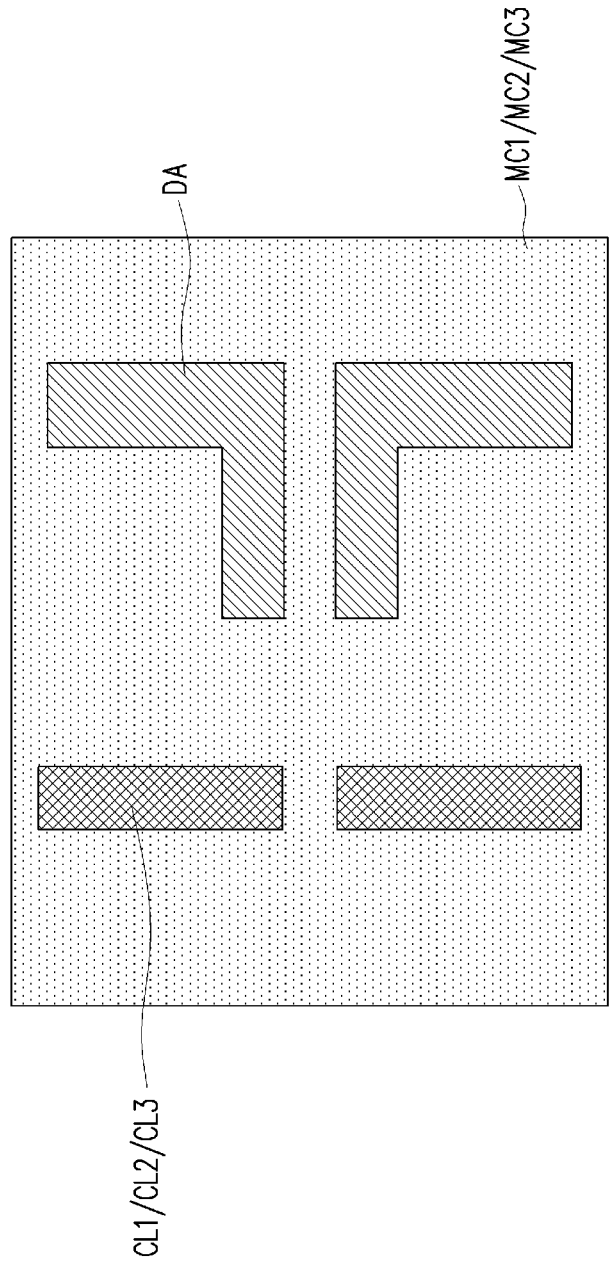
FIG. 7B is a schematic plane view illustrating a set of a dipole antenna and an adjacent conductive column in the semiconductor package shown in FIG. 7A.

FIG. 7A is a schematic cross-sectional view illustrating a semiconductor package 20a according to some embodiments of the present disclosure. FIG. 7B is a schematic plane view illustrating a set of a dipole antenna DA and an adjacent one of the conductive columns CL1/CL2/CL3 in the semiconductor package 20a as shown in FIG. 7A.

Referring to FIG. 6M and FIG. 7A, difference between the semiconductor package 20a shown in FIG. 7A and the semiconductor package 20 shown in FIG. 6M mainly lies in that the semiconductor package 20a shown in FIG. 7A further includes dipole antennas DA. According to some embodiments, the dipole antennas DA are formed in the encapsulants MC1, MC2 and MC3, and are located in a peripheral region of the semiconductor package 20a. For instance, some of the dipole antennas DA are formed in the encapsulant MC1, and located between a sidewall of the encapsulant MC1 and the conductive columns CL1 closest to the sidewall of the encapsulant MC1. Similarly, some others of the dipole antennas DP are located between a sidewall of the encapsulant MC2 and the conductive columns CL2 closest to the sidewall of the encapsulant MC2, and yet others of the dipole antennas DP are located between a sidewall of the encapsulant MC3 and the conductive columns CL3 closest to the sidewall of the encapsulant MC3. In some embodiments, the dipole antennas DP in the encapsulant MC1 are connected to some of the conductive patterns CP1 that are connected to the device die 100 through some of the additional signal lines (not shown) in the redistribution structure RDL1, some of the conductive columns CL2, the routing structures RS in the redistribution structure RDL2, some of the conductive columns CL3 and the redistribution elements RE in the redistribution structure RDL3. The dipole antennas DP in the encapsulant MC2 may be in electrical contact with the routing structures RS connected to the device die 100 through some of the conductive columns CL3 and the redistribution elements RE in the redistribution structure RDL3. In addition, the dipole antennas DP in the encapsulant MC3 may be electrically connected to the device die 100 through the redistribution elements RE in the redistribution structure RDL3. It should be noted that, for conciseness, the slots SL (as illustrated with reference to FIG. 1A and FIG. 1D) of the ground plane GP are omitted from illustration of FIG. 7A.

Referring to FIG. 7A and FIG. 7B, in some embodiments, each of the dipole antennas DA includes two conductive lines of equal length and oriented end-to-end, and includes feed lines connected to and intersected with the conductive lines. Those skilled in the art may adjust dimensions of the conductive lines and the feed lines according to design requirements, the present disclosure is not limited thereto. Furthermore, in some embodiments, the conductive columns CL1, CL2 and CL3 adjacent to the dipole antennas DA are functioned as radiation reflectors for the dipole antennas DA. In these embodiments, the conductive columns CL1, CL2 and CL3 may extend toward a horizontal direction (e.g., y-direction in the FIG. 7B) and resemble conductive walls, such that sidewalls of the conductive columns CL1, CL2 and CL3 facing toward the dipole antennas DA are laterally overlapped with the dipole antennas DA. In this way, radiation pattern of the dipole antennas DA can be modified, and gain of the dipole antenna DA in a certain direction can be enhanced.

Figure 8:
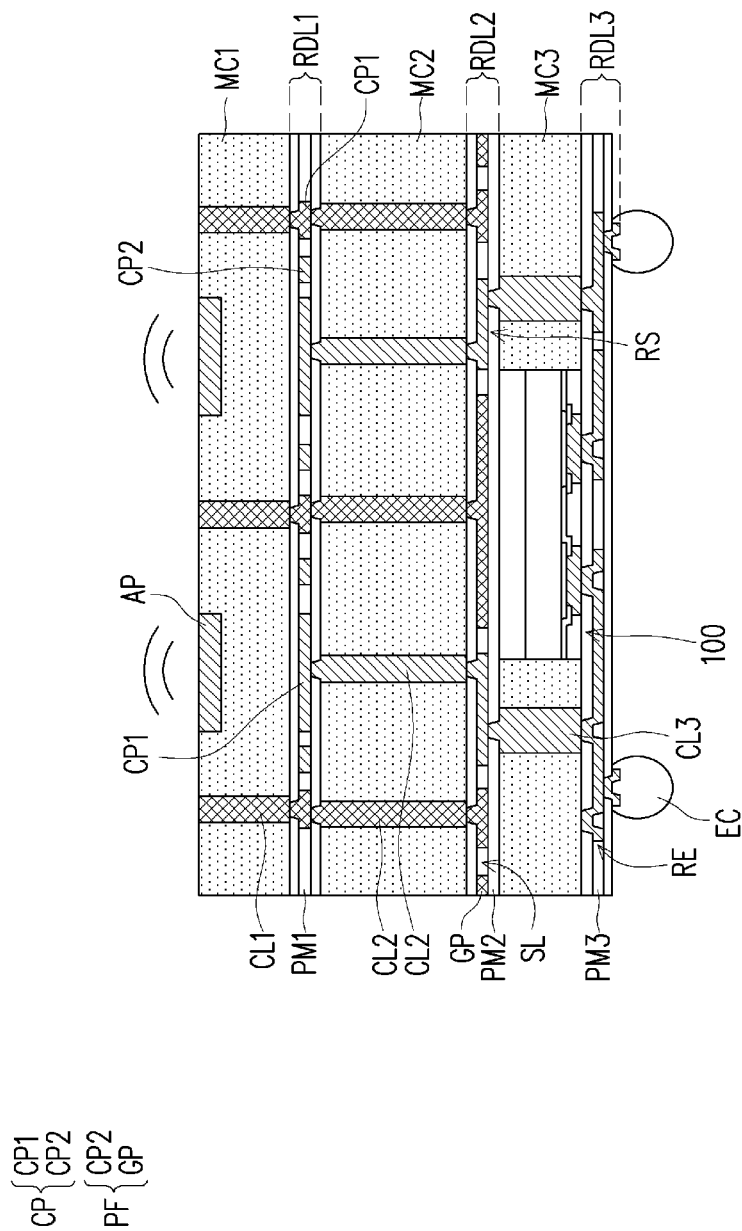
FIG. 8 through FIG. 20 are schematic cross-sectional views illustrating semiconductor packages according to various embodiments of the present disclosure.

FIG. 8 is a schematic cross-sectional view illustrating a semiconductor package 30 according to some embodiments of the present disclosure.

Referring to FIG. 6M and FIG. 8, difference between the semiconductor package 30 shown in FIG. 8 and the semiconductor package 20 shown in FIG. 6M mainly lies in that the antennas AP in the semiconductor package 30 are in capacitive coupling with some of the conductive patterns CP1 in the redistribution structure RDL1. In these embodiments, the conductive columns CL1 connecting to the antennas AP can be omitted. Moreover, the conductive patterns CP1 coupled to the antennas AP may be formed as conductive patches, and overlapped with the antennas AP. In some embodiments, the conductive patterns CP1 coupled to the antennas AP respectively have a footprint area commensurate with a footprint area of each antenna AP. In some embodiments, the footprint area of each of these conductive patterns CP1 coupled to the antennas AP is greater than a footprint area of each of the remainder conductive patterns CP1 (i.e., the conductive patterns CP1 connected to the conductive columns CL1), and also greater than a footprint area of each of the conductive patterns CP2 (i.e., the conductive patterns CP not connected to the conductive columns CL1 nor the conductive columns CL2). In certain cases, the footprint area of each of the conductive patterns CP1 coupled to the antennas AP is substantially identical to the footprint area of each antenna AP. Alternatively, the footprint area of each of the conductive patterns CP1 coupled to the antennas AP is slightly greater or smaller than the footprint area of each antenna AP.

Figure 9:
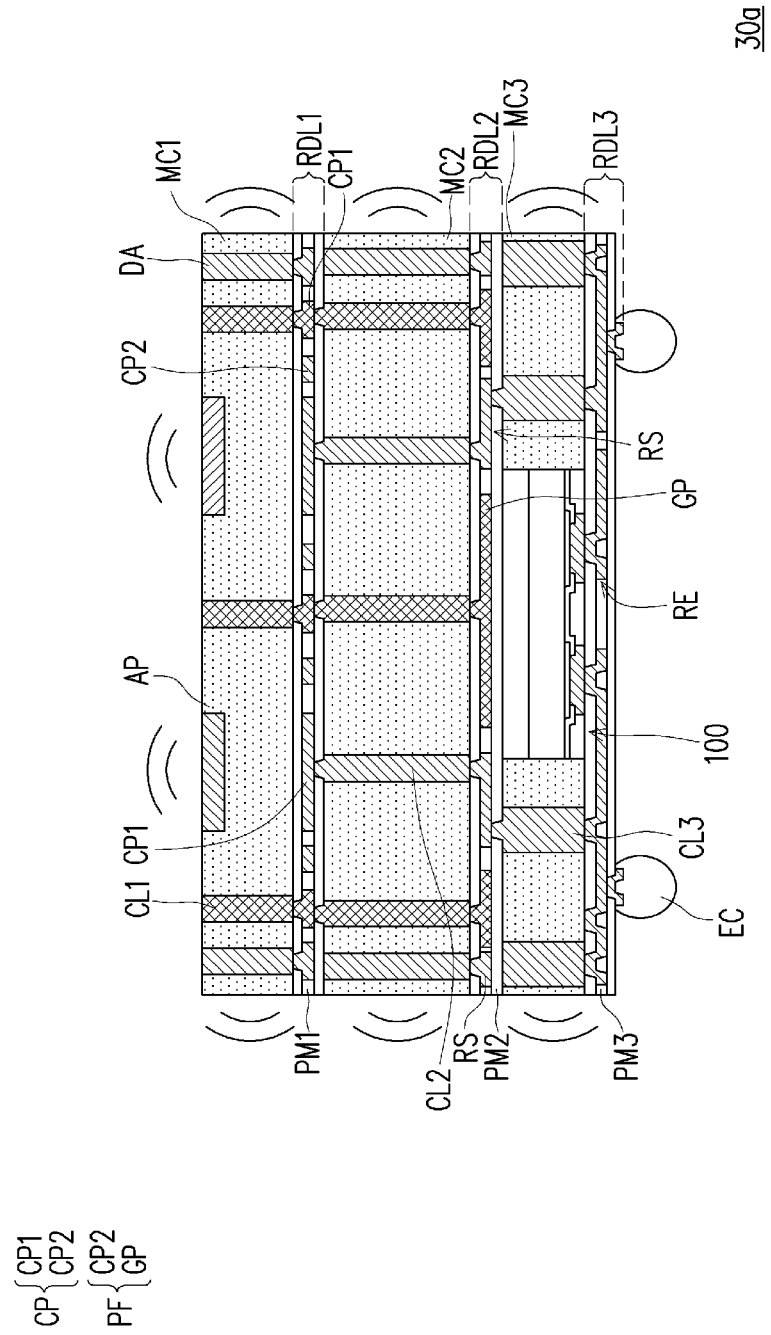

FIG. 9 is a schematic cross-sectional view illustrating a semiconductor package 30a according to some embodiments of the present disclosure.

Referring to FIG. 8 and FIG. 9, difference between the semiconductor package 30a shown in FIG. 9 and the semiconductor package 30 shown in FIG. 8 mainly lies in that the semiconductor package 30a shown in FIG. 9 further includes the dipole antennas DA. As described with reference to FIG. 7A and FIG. 7B, the dipole antennas DA herein are formed in the encapsulants MC1, MC2 and MC3, and are located in a peripheral region of the semiconductor package 30a. It should be noted that, for conciseness, the slots SL (as illustrated with reference to FIG. 1A and FIG. 1D) of the ground plane GP are omitted from illustration herein.

Figure 10:
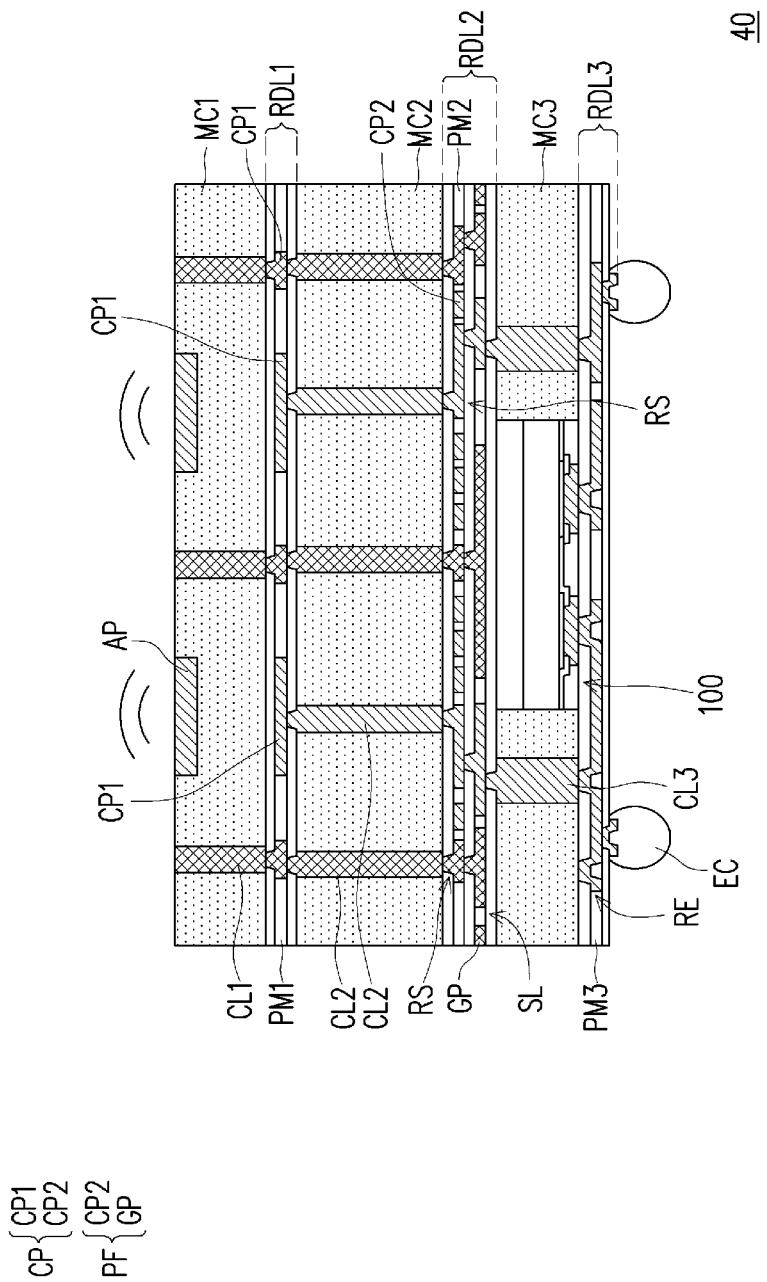

FIG. 10 is a schematic cross-sectional view illustrating a semiconductor package 40 according to some embodiments of the present disclosure.

Referring to FIG. 6M and FIG. 10, difference between the semiconductor package 40 shown in FIG. 10 and the semiconductor package 20 shown in FIG. 6M mainly lies in that the conductive patterns CP2 of the semiconductor package 40 shown in FIG. 10 are moved to the redistribution structure RDL2, whereas the conductive patterns CP1 are remained in the redistribution structure RDL1. As shown in FIG. 10, in some embodiments, the conductive patterns CP2 and the ground plane GP are integrated in the redistribution structure RDL2, and form the EBG structures PF along with one of the polymer layers PM2 in between the conductive patterns CP2 and the ground plane GP. Alternatively, the conductive patterns CP2 form the EBG structures PF alone. The conductive patterns CP2 may be electrically floated or electrically grounded, and are electrically isolated from the overlying conductive columns CL2 and the underlying conductive columns CL3. On the other hand, the ground plane GP is configured to provide a reference voltage (e.g., a ground voltage) to the overlying conductive columns CL2, CL1. As described with reference to FIG. 6G, the redistribution structure RDL2 may further include the routing structures RS. A portion of the routing structures RS connects the conductive vias CV2 to some of the overlying conductive columns CL2, and may partially spread at the same height with the ground plane GP. In addition, another portion of the routing structures RS connect the ground plane GP to others of the conductive columns CL2. By moving the conductive patterns CP2 to the redistribution structure RDL2, a vertical distance between the redistribution structure RDL1 and the redistribution structure RDL2 can be further reduced as a result of breaking the current loop induced on the ground plane GP and suppression of the surface wave at the ground plane GP. In other words, a thickness of the encapsulant MC2 as well as a height of the conductive columns CL2 can be reduced.

In alternative embodiments, the ground plane GP is disposed in the redistribution structure RDL3. In these alternative embodiments, the ground plane GP and the redistribution elements RE are integrated in the redistribution structure RDL3. The conductive patterns CP2 in the redistribution structure RDL2, the ground plane GP in the redistribution structure RDL3 and dielectric components in between (e.g., the encapsulant MC3) form the EBG structures PF. Alternatively, the conductive patterns CP2 form the EBG structures PF alone.

Figure 11:
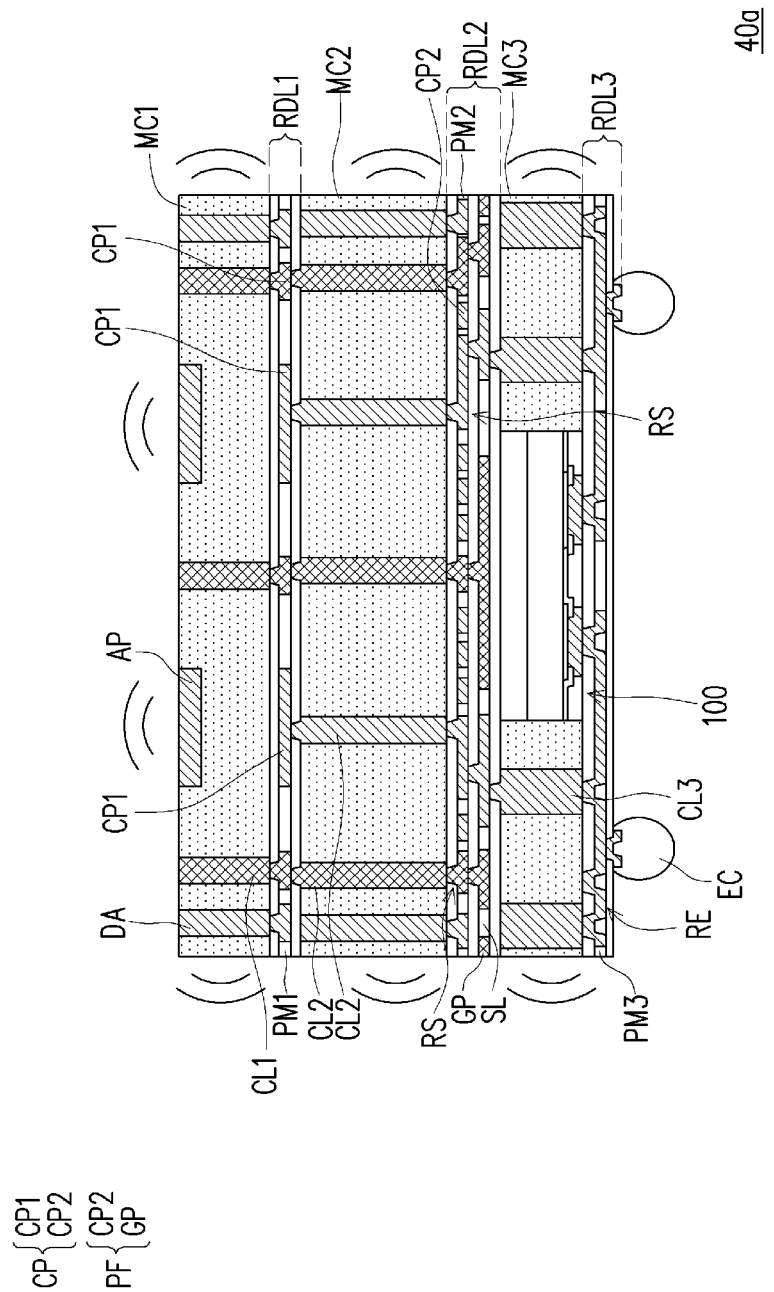

FIG. 11 is a schematic cross-sectional view illustrating a semiconductor package 40a according to some embodiments of the present disclosure.

Referring to FIG. 10 and FIG. 11, difference between the semiconductor package 40a shown in FIG. 11 and the semiconductor package 40 shown in FIG. 10 mainly lies in that the semiconductor package 40a shown in FIG. 11 further includes the dipole antennas DP. As described with reference to FIG. 7A and FIG. 7B, the dipole antennas DA herein are formed in the encapsulants MC1, MC2 and MC3, and are located in a peripheral region of the semiconductor package 40a. It should be noted that, for conciseness, the slots SL (as illustrated with reference to FIG. 1A and FIG. 1D) of the ground plane GP are omitted from illustration herein. In addition, the ground plane GP may be alternatively moved to the redistribution structure RDL3.

Figure 12:
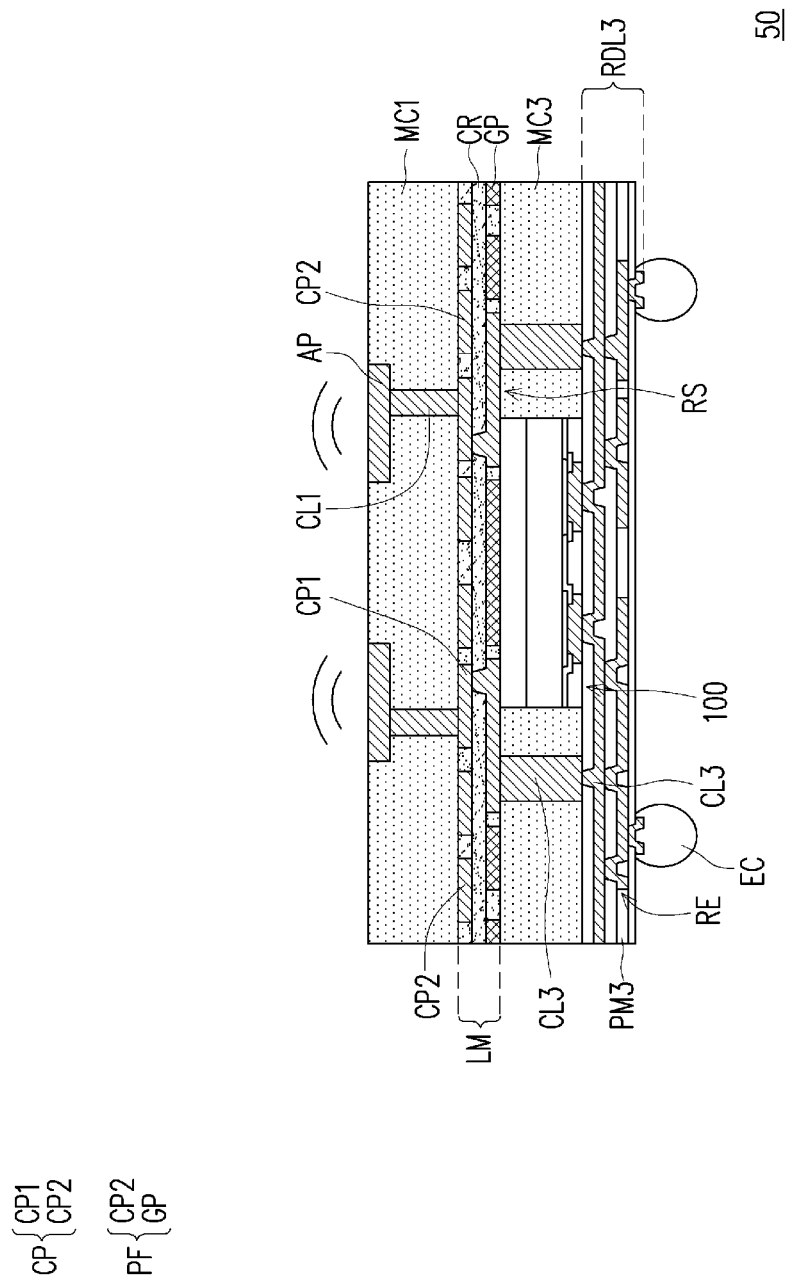

FIG. 12 is a schematic cross-sectional view illustrating a semiconductor package 50 according to some embodiments of the present disclosure.

Referring to FIG. 12, in some embodiments, the conductive patterns CP and the ground plane GP are integrated in a pre-fabricated lamination layer LM, rather than being formed in the redistribution structures RDL1, RDL2, respectively. In addition, the conductive columns CL2 and the encapsulant MC2 are omitted. In this way, the lamination layer LM is provided between the encapsulant MC1 and the encapsulant MC3. In some embodiments, the lamination layer LM is similar to a package substrate (e.g., a printed circuit board), and having a stack of dielectric core layers CR and conductive components (including the conductive patterns CP and the ground plane GP) formed in the stack of dielectric core layers CR. After formation of the encapsulant MC1 (as described with reference to FIG. 6C), the lamination layer LM may be attached on the encapsulant MC1, and the obtained structure is subjected to the following process steps as described with reference to FIG. 6H through FIG. 6M, in order to complete manufacturing of the semiconductor package 50. In the embodiments shown in FIG. 12, the conductive columns CL1 (as shown in FIG. 6M) are omitted. However, the semiconductor package 50 shown in FIG. 12 may alternatively incorporate the conductive columns CL1.

Figure 13:
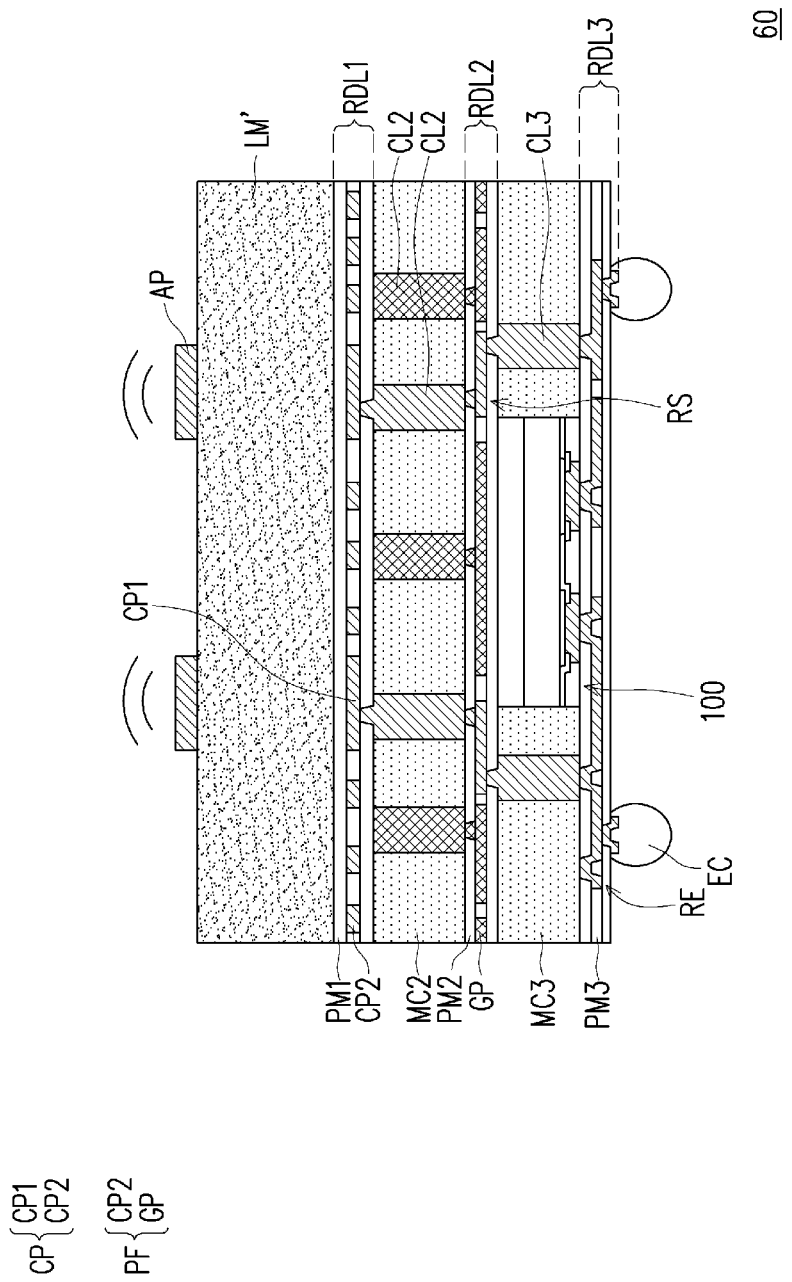

FIG. 13 is a schematic cross-sectional view illustrating a semiconductor package 60 according to some embodiments of the present disclosure.

Referring to FIG. 13, in some embodiment, the antennas AP are formed over a lamination layer LM', rather than being encapsulated by the encapsulant MC1 (as shown in FIG. 6M). In these embodiments, the encapsulant MC1 as well as the conductive columns CL1 may be omitted, and the antennas AP are in capacitive coupling with some of the conductive patterns CP1 in the redistribution structure RDL1 (as similar to the embodiments described with reference to FIG. 8). Some of the conductive columns CL2 laterally encapsulated by the encapsulant MC2 are electrically grounded and laterally surrounding each of the antennas AP, such that coupling between the antennas AP can still be blocked by the grounded conductive columns CL2. In addition, additional resonance may be generated between the antennas AP and the grounded conductive columns CL2. The lamination layer LM' may be similar to the dielectric core layer CR as shown in FIG. 12. In some embodiments, the lamination layer LM' may be provided on the redistribution structure RDL1 after removal of the carrier substrate CA (as described with reference to FIG. 6M), and the antennas AP are subsequently formed on the lamination layer LM' by a stencil printing process. Alternatively, the antennas AP are formed by a lithography process as well as a deposition process, a plating process or a combination thereof.

Although the grounded conductive columns CL2 and the conductive patterns CP2 are both formed in the semiconductor package 60, the grounded conductive columns CL2 or the conductive patterns CP2 can be alternatively omitted from the semiconductor package 60.

Figure 14:
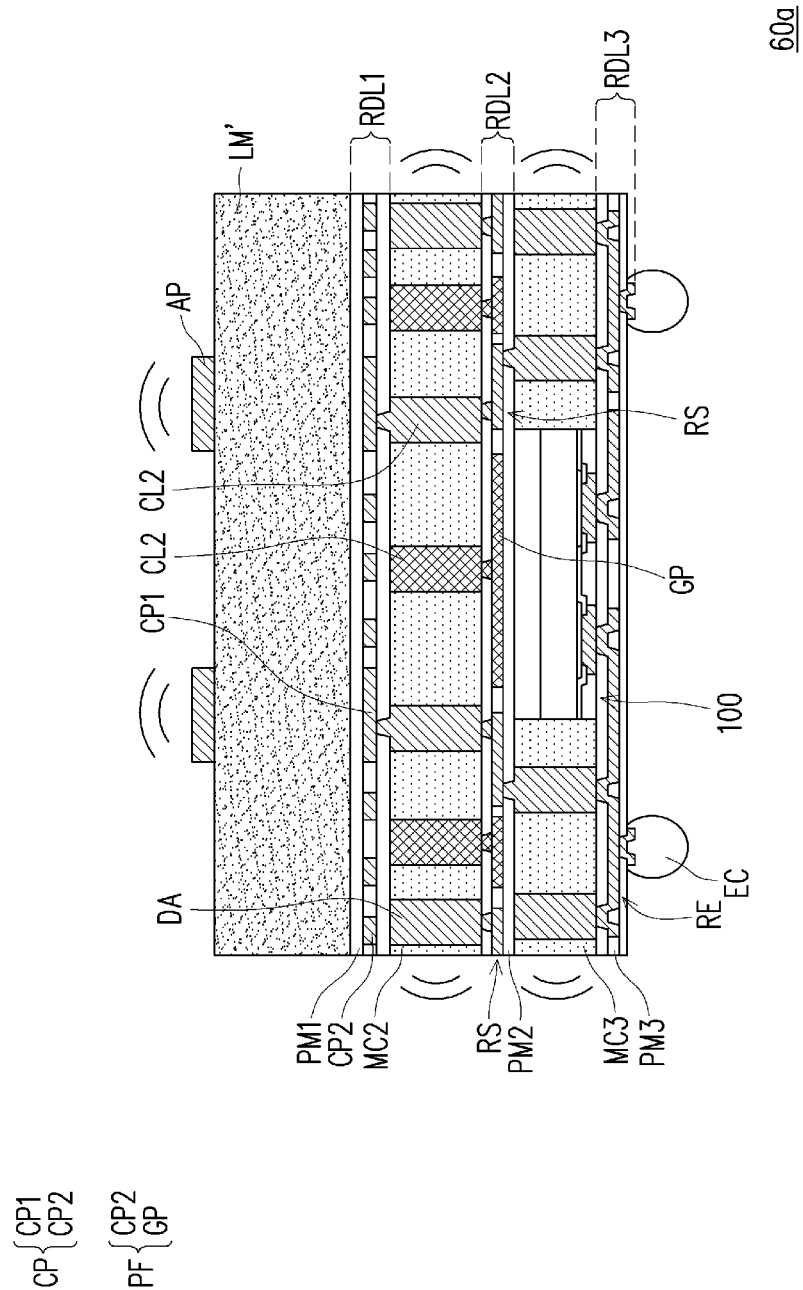

FIG. 14 is a schematic cross-sectional view illustrating a semiconductor package 60a according to some embodiments of the present disclosure.

Referring to FIG. 13 and FIG. 14, difference between the semiconductor package 60a shown in FIG. 14 and the semiconductor package 60 shown in FIG. 13 mainly lies in that the semiconductor package 60a shown in FIG. 14 further includes the dipole antennas DP. As shown in FIG. 14, the dipole antennas DP are formed in peripheral regions of the encapsulants MC2, MC3. In some embodiments, the dipole antennas DP in the encapsulant MC2 are connected to the routing structures RS in the redistribution structure RDL2, which are connected to the device die 100 through some of the conductive columns CL3 and the redistribution elements RE in the redistribution structure RDL3. In addition, the dipole antennas DP in the encapsulant MC3 may be electrically connected to the device die 100 through the redistribution elements RE in the redistribution structure RDL3. As similar to the description with reference to FIG. 7A and FIG. 7B, the conductive columns CL2, CL3 adjacent to the dipole antennas DA may be functioned as radiation reflectors for the dipole antennas DA. Furthermore, it should be noted that, for conciseness, the slots SL (as illustrated with reference to FIG. 1A and FIG. 1D) of the ground plane GP are omitted from illustration of FIG. 14.

Figure 15:
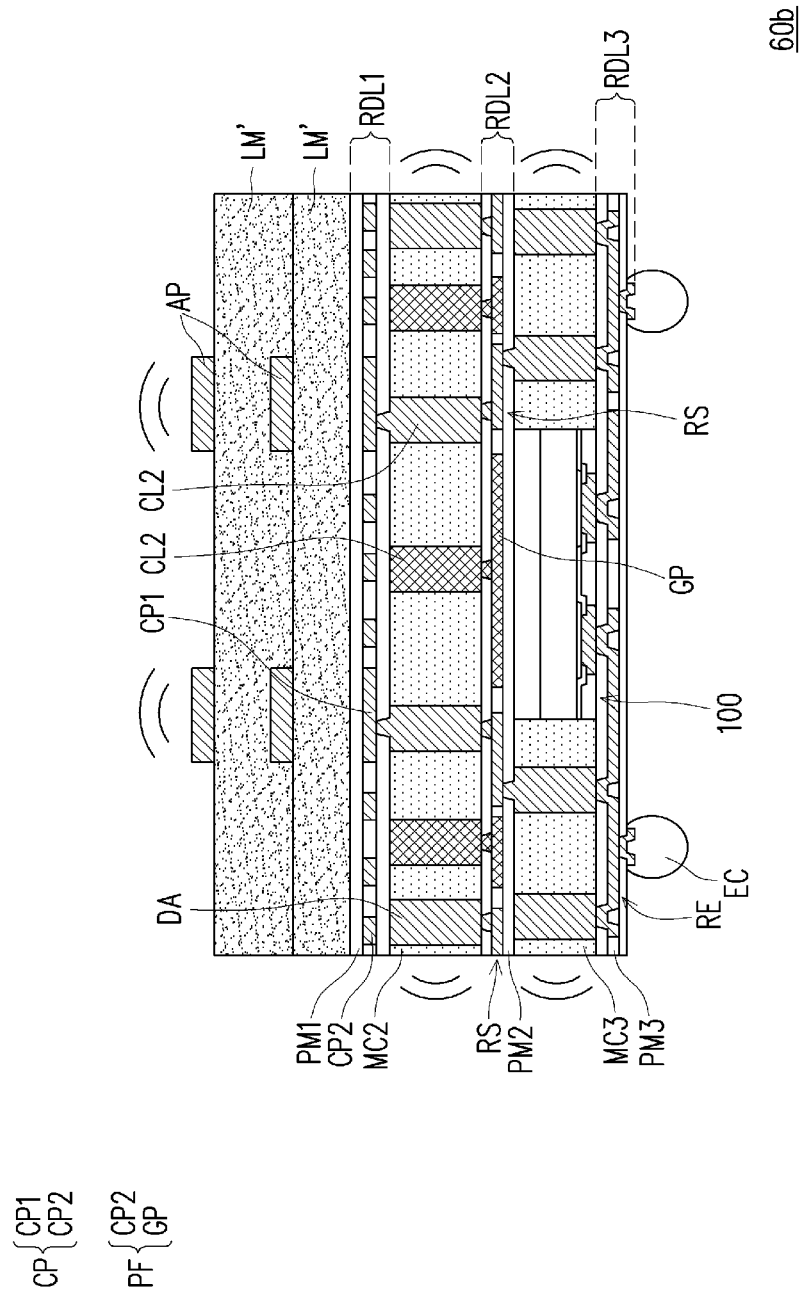

FIG. 15 is a schematic cross-sectional view illustrating a semiconductor package 60b according to some embodiments of the present disclosure.

Referring to FIG. 14 and FIG. 15, difference between the semiconductor package 60b shown in FIG. 15 and the semiconductor package 60a shown in FIG. 14 mainly lies in that the a stack of lamination layers LM' (e.g., two lamination layers LM') are provided on the redistribution structure RDL1 in the semiconductor package 60b shown in FIG. 15. In addition, as shown FIG. 15, each of the lamination layers LM' is covered by some antennas AP. The antennas AP on one of the lamination layers LM' are overlapped with the antennas AP on another one of the lamination layers LM', and are overlapped with the conductive patterns CP1 capacitively coupled to the antennas AP. In some embodiments, the steps of providing the lamination layer LM' on the redistribution structure RDL1 and forming the antennas AP on the lamination layer LM' (as described with reference to FIG. 13) are repeated to form the stack of lamination layers LM' each covered with some of the antennas AP.

Figure 16:
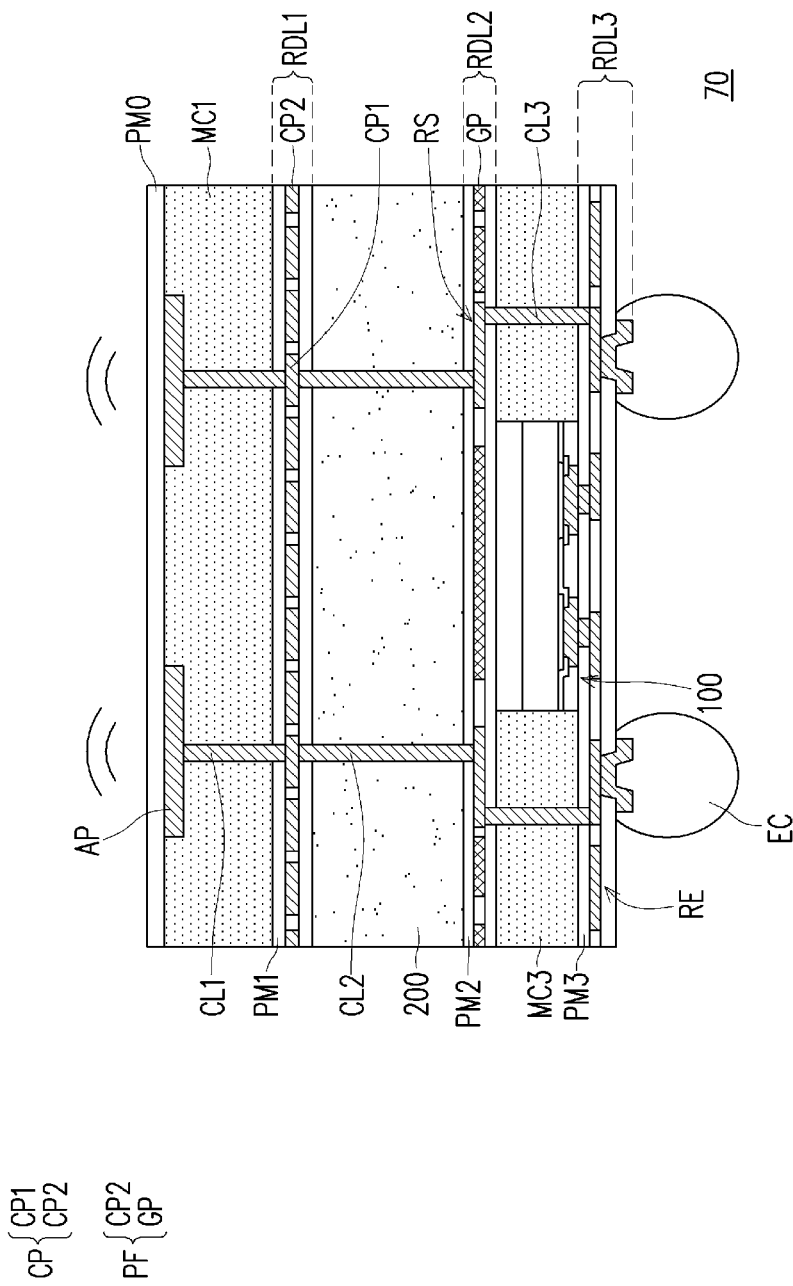

FIG. 16 is a schematic cross-sectional view illustrating a semiconductor package 70 according to some embodiments of the present disclosure.

Referring to FIG. 6M and FIG. 16, the conductive columns CL2 in the semiconductor package 70 shown in FIG. 16 are formed in another substrate 200, rather than being laterally encapsulated by an encapsulant (e.g., the encapsulant MC2 shown in FIG. 6M). The conductive columns CL2 are connected upwardly to the antennas AP through conductive components including the conductive patterns CP1 in the redistribution structure RDL1 and the conductive columns CL1 in the encapsulant MC1. In addition, the conductive columns CL2 are connected downwardly to the device die 100 through conductive components including the routing structures RS in the redistribution structure RDL2, the conductive columns CL3 in the encapsulant MC3 and the redistribution elements RE in the redistribution structure RDL3. In some embodiments, the substrate 200 is a semiconductor substrate (e.g., a silicon wafer) or a glass substrate, and the conductive columns CL2 are through substrate vias (TSVs). Regarding manufacturing method of the semiconductor package 70, the semiconductor package 70 may be formed by bonding a wafer structure W1 to another wafer structure W2. In some embodiments, the wafer structure W1 includes the device die 100, the conductive columns CL3, the encapsulant MC3 laterally encapsulating the device die 100 and the conductive columns CL3, and the redistribution structures RDL2, RDL3 formed at opposite sides of the encapsulant MC3. In some embodiments, the device die 100 is facing down, and an active side of the device die 100 is facing toward the redistribution structure RDL3, whereas a back side of the device die 100 is facing toward the redistribution structure RDL2. On the other hand, the wafer structure W2 may include the substrate 200, the conductive columns CL2 penetrating through the substrate 200, the redistribution structure RDL1 formed at a side of the substrate 200, the conductive columns CL1 and the antennas AP formed on the redistribution structure RDL1, and the encapsulant MC1 laterally encapsulating the conductive columns CL1 and the antennas AP. In some embodiments, the polymer layer PM0 is formed on the encapsulant MC1. During the bonding of the wafer structures W1, W2, a surface of the substrate 200 facing away from the redistribution structure RDL1 and a surface of the redistribution structure RDL2 facing away from the encapsulant MC3 are attached and bonded with each other. In addition, after the bonding process, the electrical connectors EC may be formed at a side of the redistribution structure RDL3 facing away from the encapsulant MC3.

Figure 17:
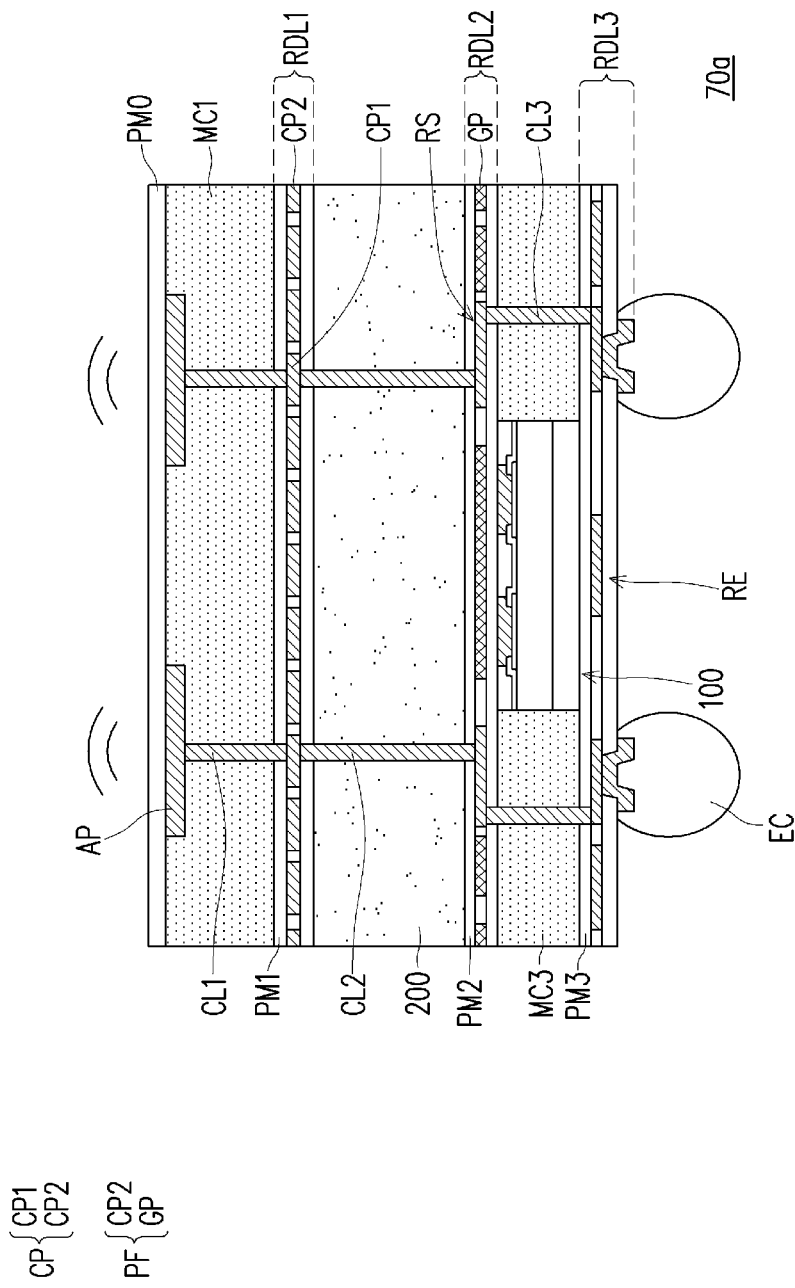

FIG. 17 is a schematic cross-sectional view illustrating a semiconductor package 70a according to some embodiments of the present disclosure.

Referring to FIG. 16 and FIG. 17, the semiconductor package 70a shown in FIG. 17 is similar to the semiconductor package 70 shown in FIG. 16, except that the device die 100 of the semiconductor package 70a shown in FIG. 17 is facing up. As shown in FIG. 17, an active side of the device die 100 is facing toward the redistribution structure RDL2, whereas a back side of the device die 100 is facing toward the redistribution structure RDL3. In these embodiments, additional routing structures (not shown) may be formed in the redistribution structure RDL2 for connecting the device die 100 to the conductive columns CL2, and for connecting the device die 100 to the conductive columns CL3.

Figure 18:
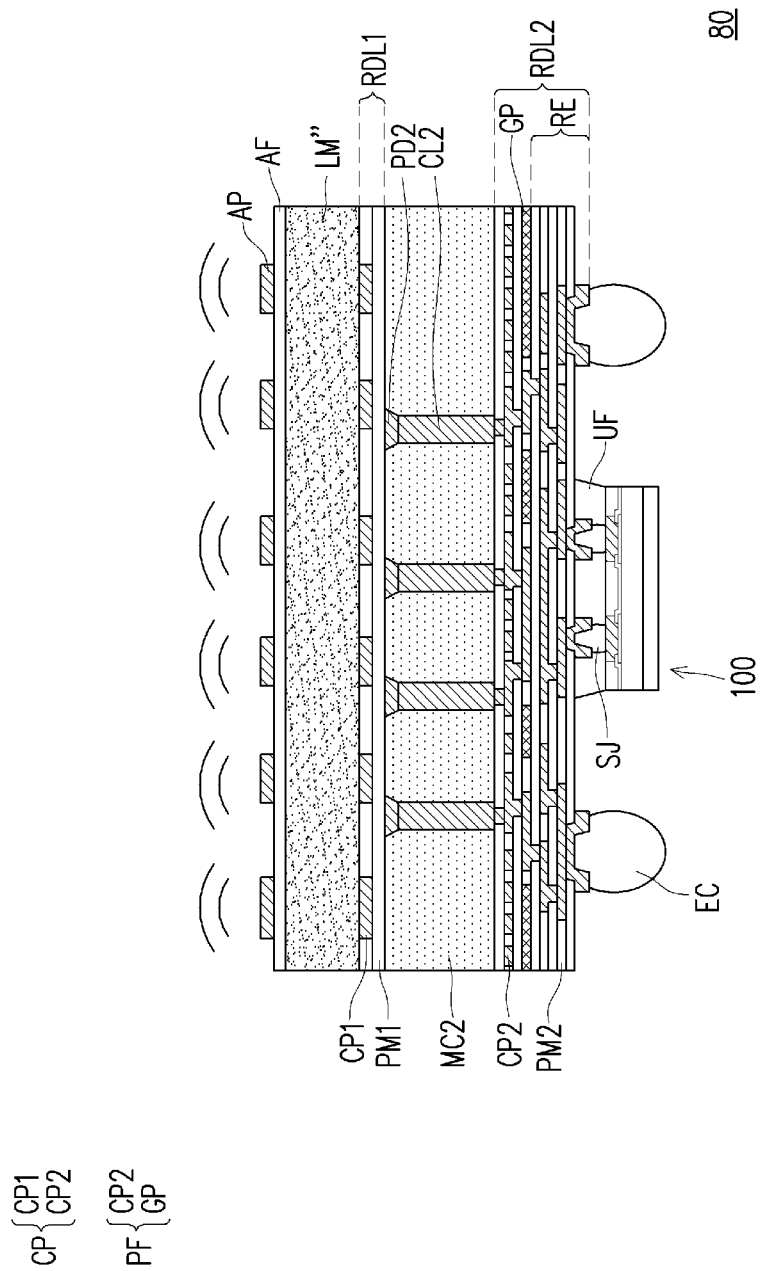

FIG. 18 is a schematic cross-sectional view illustrating a semiconductor package 80 according to some embodiments of the present disclosure.

Referring to FIG. 1A and FIG. 18, the semiconductor package 80 shown in FIG. 18 is similar to the semiconductor package 10 shown in FIG. 1A, except that the antennas AP in the semiconductor package 80 shown in FIG. 18 are not encapsulated by an encapsulant (e.g., the encapsulant MC1 shown in FIG. 1A), but are formed on a lamination layer LM" located over the redistribution structure RDL1. In some embodiments, an adhesion layer AF is formed between the antennas AP and the lamination layer LM". For instance, the lamination layer LM" is similar to a core dielectric layer in a package substrate (e.g., a printed circuit board), and the adhesion layer AF may be a die attach film. In addition, in some embodiments, the conductive patterns CP2 are moved to the redistribution structure RDL2, whereas the conductive patterns CP1 capacitively coupled to the antennas AP are remained in the redistribution structure RDL1. The conductive patterns CP2 are located between the ground plane GP and the encapsulant MC2. In addition, in some embodiments, the redistribution elements RE in the redistribution structure RDL2 are located between the ground plane GP and a bottom side of the redistribution structure RDL2, and are connected to the device die 100 and the electrical connectors EC provided at the bottom side of the redistribution structure RDL2. Moreover, additional routing structures (not shown) may be formed in the redistribution structure RDL2, and configured to connect the redistribution elements RE to the overlying conductive columns CL2. Similarly, the conductive columns CL2 and the conductive pads PD2 are connected to the conductive patterns CP1 through some routing structures (not shown) formed in the redistribution structure RDL1.

In some embodiments, a manufacturing method of the semiconductor package 80 may begin with providing the lamination layer LM" with the adhesion layer AF attached at a back side of the lamination layer LM". Thereafter, the redistribution structure RDL1 as well as other components including the conductive pads PD2, the conductive columns CL2, the encapsulant MC2 and the redistribution structure RDL2 are formed on a front side of the lamination layer LM", and the device die 100 and the electrical connectors EC are provided at an exposed surface of the redistribution structure RDL2. Subsequently, the current structure may be flipped over, and the antennas AP are formed on of the adhesive layer AF at the back side of the lamination layer LM".

Figure 19:
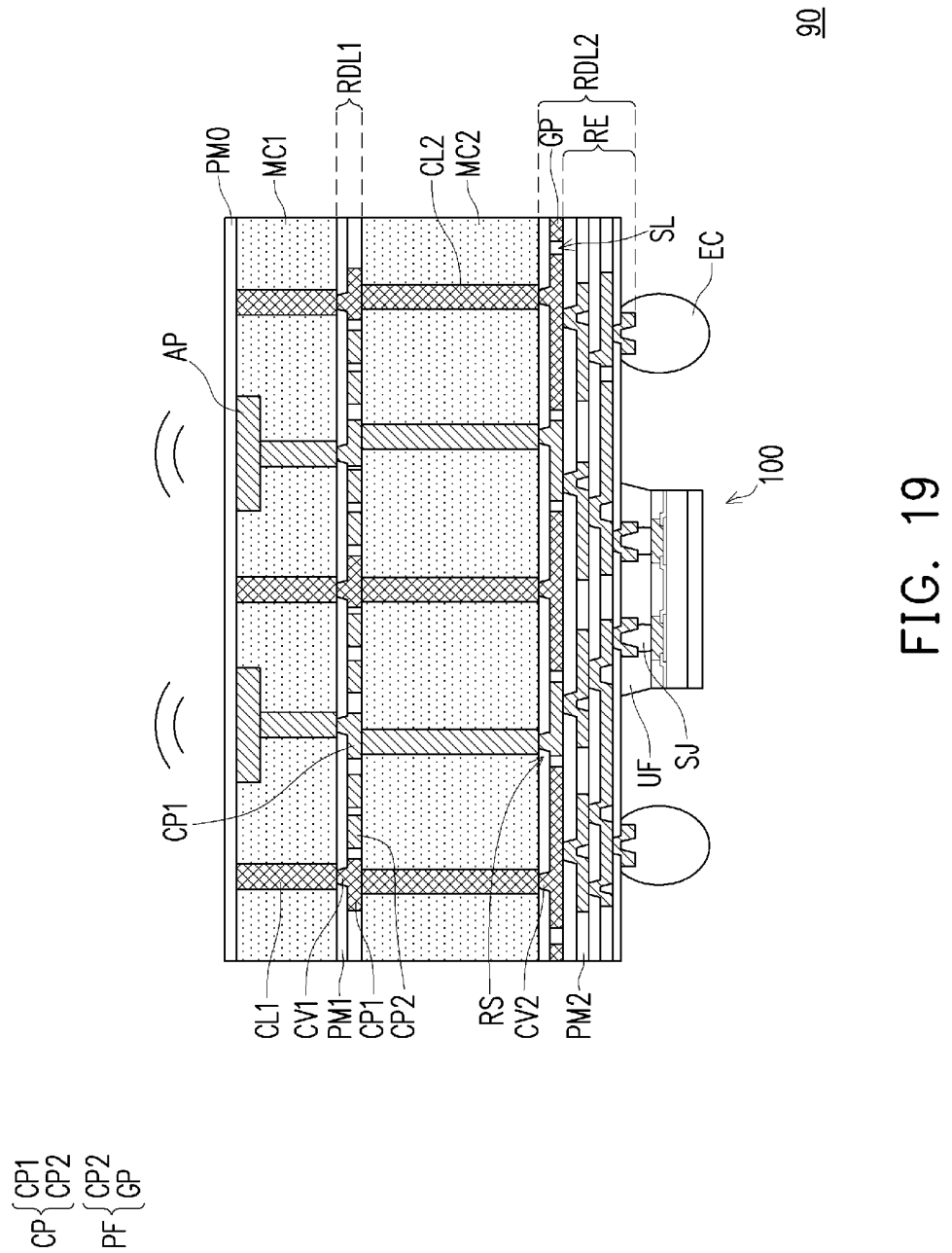

FIG. 19 is a schematic cross-sectional view illustrating a semiconductor package 90 according to some embodiments of the present disclosure.

Referring to FIG. 1A and FIG. 19, the semiconductor package 90 shown in FIG. 19 is similar to the semiconductor package 10 shown in FIG. 1A, except that the conductive columns CL1, CL2 shown in FIG. 19 are formed by a deposition process, a plating process or a combination thereof. In such embodiments shown in FIG. 19, the conductive pads PD1, PD2 as described with reference to FIG. 1A may be omitted. Consequently, the conductive columns CL1 may extend to a bottom surface of the polymer layer PM0, and the conductive columns CL2 may extend to a bottom surface of the redistribution structure RDL1. Further, the bottom surfaces of the antennas AP may not be recessed in corresponding to the conductive columns CL1 connected from below. In other words, the antennas AP may be cured before formation of the conductive columns CL1. In some embodiments, the conductive columns CL1 are formed before formation of the encapsulant MC1, and the conductive columns CL2 are formed before formation of the encapsulant MC2. In alternative embodiments, formation of the conductive columns CL1 follows the formation of the encapsulant MC1, and formation of the conductive columns CL2 follows the formation of the encapsulant MC2.

Figure 20:
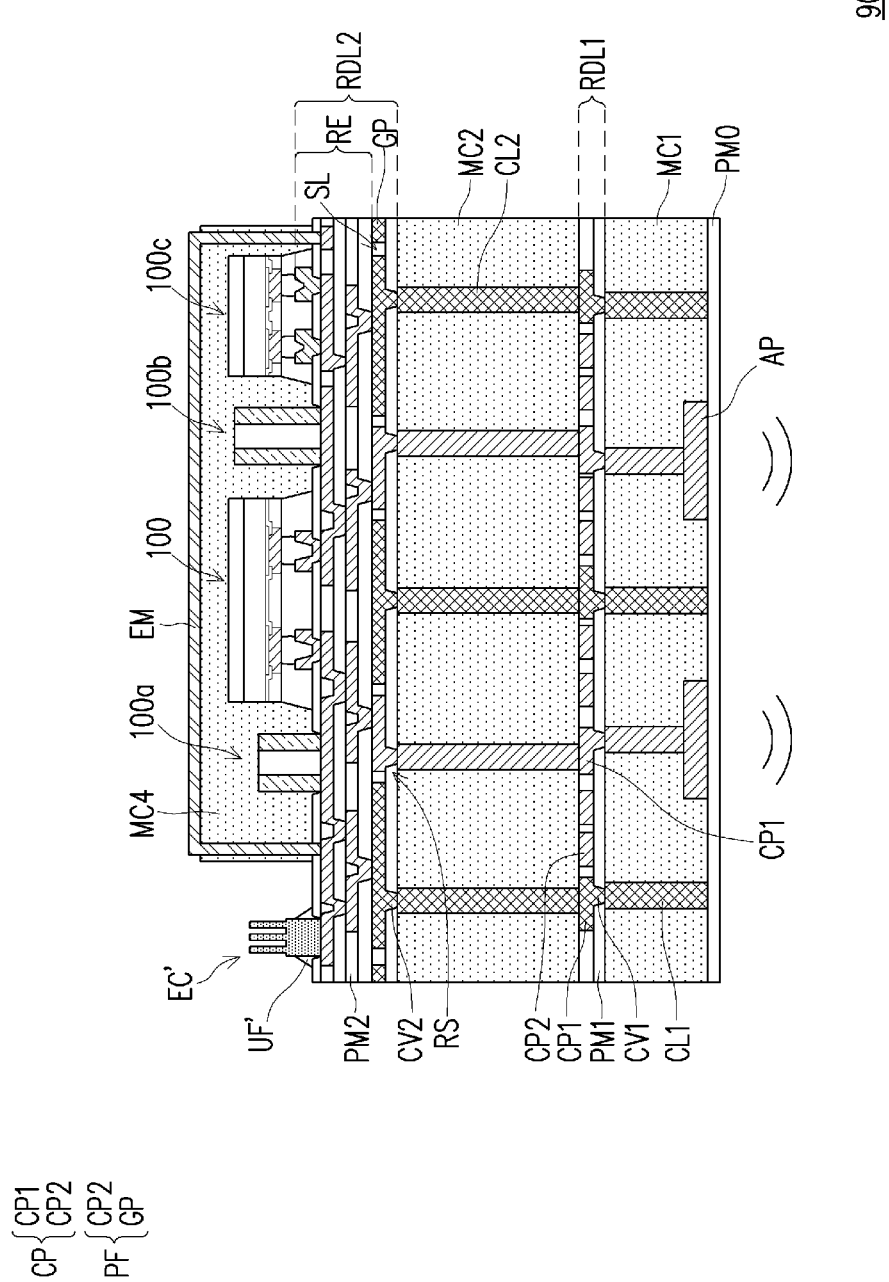

FIG. 20 is a schematic cross-sectional view illustrating a semiconductor package 90a according to some embodiments of the present disclosure. The semiconductor package 90a shown in FIG. 20 is similar to the semiconductor package 90 shown in FIG. 19. Only differences therebetween will be described, the same or the like parts will be omitted.

Referring to FIG. 19 and FIG. 20, the structure shown in FIG. 20 can be formed from flipping over the structure shown in FIG. 19. Further, electronic components 100a, 100b, 100c as well as the device die 100 are attached on the redistribution structure RDL2, and an additional encapsulant MC4 is formed on the redistribution structure RDL2 for encapsulating the device die 100 and the electronic components 100a, 100b, 100c. The electronic components 100a, 100b, 100c may respectively be a device die, a passive device or the like. In some embodiments, an electromagnetic shielding EM is further formed to cover a top surface of the encapsulant MC4, for providing electromagnetic shielding for the device die 100 as well as the electronic components 100a, 100b, 100c in the encapsulant MC4. In these embodiments, an extending portion of the electromagnetic shielding EM may penetrate through the encapsulant MC4 and establish electrical contact with the redistribution structure RDL2. Moreover, the electrical connectors EC as described with reference to FIG. 1A are replaced by electrical connectors EC' used in high frequency applications, such as subminiature version A (SMA) connectors. In addition, an underfill UP may be used for attaching the electrical connectors EC' to the redistribution structure RDL2.

As above, the semiconductor package according to various embodiments of the present disclosure includes a device die and patch antennas vertically spaced apart from and electrically coupled to the device die, and includes at least one redistribution structure between the device die and the patch antennas. EBG structures are disposed in the at least one redistribution structure for breaking a current loop induced on a ground plane by the patch antennas. The current loop may result in compromise of gain and efficiency of the patch antennas. Therefore, by disposing the EBG structure, such problem can be avoided. On top of that, a vertical distance between the patch antennas and the at least one redistribution structure can be reduced. In addition, conductive patterns in the EBG structures may be functioned as radiation reflectors for further enhancing gain of the patch antennas. Furthermore, interference between the patch antennas and the device die may be blocked by the conductive patterns in the EBG structures.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a semiconductor package is provided. The semiconductor package comprises: patch antennas, encapsulated by a first encapsulant; a device die, vertically spaced apart from the patch antennas, and electrically coupled to the patch antennas; and at least one redistribution structure, disposed between the patch antennas and the device die, and comprising electromagnetic bandgap (EBG) structures laterally surrounding each of the patch antennas.

In another aspect of the present disclosure, a semiconductor package is provided. The semiconductor package comprises: patch antennas, formed over at least one lamination layer; a device die, vertically spaced apart from the patch antennas, and electrically coupled to the patch antennas; and at least one redistribution structure, disposed between the patch antennas and the device die, and comprising EBG structures laterally surrounding each of the patch antennas.

In yet another aspect of the present disclosure, a manufacturing method of a semiconductor package is provided. The method comprises: forming patch antennas on a carrier substrate; encapsulating the patch antennas by a first encapsulant; forming a first redistribution structure on the first encapsulant, wherein the first redistribution structure comprises conductive patterns laterally surrounding each of the patch antennas and electrically isolated from the patch antennas; forming conductive columns on the first redistribution structure; encapsulating the conductive columns by a second encapsulant; forming a second redistribution structure on the second encapsulant; attaching a device die on the second redistribution structure; and removing the carrier substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A manufacturing method of a semiconductor package, comprising:

forming patch antennas on a carrier substrate;

forming a first encapsulant on the carrier substrate;

forming a first redistribution structure on the first encapsulant, wherein the first redistribution structure comprises conductive patterns laterally surrounding each of the patch antennas and electrically isolated from the patch antennas;

forming conductive columns on the first redistribution structure;

encapsulating the conductive columns by a second encapsulant;

forming a second redistribution structure on the second encapsulant;

attaching a device die on the second redistribution structure; and removing the carrier substrate, wherein the manufacturing method of the semiconductor package further comprises: forming conductive pads and additional conductive columns on the carrier substrate before formation of the first encapsulant, wherein a first group of the additional conductive columns respectively stand on one of the conductive pads, and a second group of the additional conductive columns respectively stand on one of the patch antennas.

2. The manufacturing method of the semiconductor package according to claim 1, wherein formation of the second redistribution structure comprises forming a ground plane overlapping the patch antennas and the conductive patterns.

3. The manufacturing method of the semiconductor package according to claim 1, further comprising:

forming a polymer layer on the carrier substrate before formation of the patch antennas.

4. The manufacturing method of the semiconductor package according to claim 1, the patch antennas are each surrounded by the conductive pads and the additional conductive columns.

5. The manufacturing method of the semiconductor package according to claim 1, wherein the conductive pads, the patch antennas and the additional conductive columns are encapsulated by the first encapsulant during formation of the first encapsulant.

6. The manufacturing method of the semiconductor package according to claim 1, wherein formation of the patch antennas, the conductive pads and the additional conductive columns comprises:
   forming conductive pastes on the carrier substrate by a stencil printing process;
   placing pre-fabricated conductive pins on the conductive pastes; and
   curing the conductive pastes and the pre-fabricated conductive pins, wherein the conductive pastes are cured to form the patch antennas and the conductive pads, and the pre-fabricated conductive pins form the additional conductive columns.

7. The manufacturing method of the semiconductor package according to claim 6, wherein a stencil is used for positioning the pre-fabricated conductive pins on the conductive pastes during placement of the pre-fabricated conductive pins.

8. The manufacturing method of the semiconductor package according to claim 1, further comprising forming conductive pads on the first redistribution structure before formation of the conductive columns, wherein the conductive columns respectively stand on one of the conductive pads, and the conductive pads as well as the conductive columns are encapsulated by the second encapsulant during formation of the second encapsulant.

9. The manufacturing method of the semiconductor package according to claim 8, wherein formation of the conductive pads and the conductive columns comprises:
   forming conductive pastes on the first redistribution structure by a stencil printing process;
   placing pre-fabricated conductive pins on the conductive pastes by using a stencil; and
   curing the conductive pastes and the pre-fabricated conductive pins, wherein the conductive pastes are cured to form the conductive pads, and the pre-fabricated conductive pins form the conductive columns.

10. A manufacturing method of a semiconductor package, comprising:
   forming patch antennas on a carrier substrate;
   encapsulating the patch antennas by a first encapsulant;
   forming a first redistribution structure on the first encapsulant;
   forming conductive columns on the first redistribution structure, wherein a first group of the conductive columns are coupled to the patch antennas, and a second group of the conductive columns are isolated from and arranged to laterally surround each of the conductive columns in the first group;
   encapsulating the conductive columns by a second encapsulant;
   forming a second redistribution structure on the second encapsulant;
   attaching a device die on the second redistribution structure;
   encapsulating the device die by a third encapsulant;
   forming a third redistribution structure on the third encapsulant and the device die; and
   removing the carrier substrate,
   wherein formation of the first redistribution structure or the second redistribution structure comprises forming separate conductive patterns laterally surrounding each of the patch antennas and electrically isolated from the patch antennas, and formation of the second redistribution structure comprises forming a ground plane overlapping the patch antennas and the conductive patterns.

11. The manufacturing method of a semiconductor package according to claim 10, further comprising forming additional conductive columns on the carrier substrate after formation of the patch antennas and before formation of the first encapsulant.

12. The manufacturing method of the semiconductor package according to claim 11, wherein a first group of the additional conductive columns respectively stand on one of the patch antennas, and a second group of the additional conductive columns are disposed around the patch antennas.

13. The manufacturing method of the semiconductor package according to claim 11, wherein all of the additional conductive columns are disposed around the patch antennas, and formation of the first redistribution structure comprises forming additional conductive patterns capacitively coupled to and overlapped with the patch antennas.

14. The manufacturing method of the semiconductor package according to claim 10, further comprising forming additional conductive columns on the second redistribution structure before formation of the third encapsulant, wherein the device die is located between adjacent ones of the additional conductive columns.

15. The manufacturing method of the semiconductor package according to claim 10, further comprising forming dipole antennas in the first, second and third encapsulants.

16. A manufacturing method of a semiconductor package, comprising:
   forming a first redistribution structure on a carrier substrate;
   forming conductive columns on the first redistribution structure;
   encapsulating the conductive columns by a first encapsulant;
   forming a second redistribution structure on the first encapsulant;
   attaching a device die on the second redistribution structure;
   removing the carrier substrate;
   providing a lamination layer on a side of the first redistribution structure facing away from the first encapsulant; and
   forming patch antennas on a side of the first redistribution structure facing away from the first redistribution structure,
   wherein a first group of the conductive columns are coupled to the patch antennas, and a second group of the conductive columns are isolated from and arranged to laterally surround each of the conductive columns in the first group.

17. The manufacturing method of the semiconductor package according to claim 16, further comprising:
   encapsulating the device die by a second encapsulant; and
   forming a third redistribution structure on the second encapsulant and the device die.

18. The manufacturing method of the semiconductor package according to claim 17, further comprising forming dipole antennas in the first and second encapsulants.

19. The manufacturing method of the semiconductor package according to claim 16, wherein formation of the first redistribution structure or the second redistribution structure comprises forming separate conductive patterns laterally surrounding each of the patch antennas and electrically isolated from the patch antennas, and formation of the second redistribution structure comprises forming a ground plane overlapping the patch antennas and the conductive patterns.

20. The manufacturing method of the semiconductor package according to claim 16, wherein formation of the first redistribution structure comprises forming conductive patterns capacitively coupling to the patch antennas and overlapped with the patch antennas.

* * * * *